(12) United States Patent
Hsu et al.

(10) Patent No.: US 9,939,568 B2
(45) Date of Patent: Apr. 10, 2018

(54) PHOTOSENSITIVE RESIN COMPOSITION FOR COLOR FILTER AND APPLICATION OF THE SAME

(71) Applicant: Chi Mei Corporation, Tainan (TW)

(72) Inventors: Jung-Pin Hsu, Tainan (TW); Bo-Hsuan Lin, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 15/147,913

(22) Filed: May 6, 2016

(65) Prior Publication Data

US 2016/0327863 A1 Nov. 10, 2016

(30) Foreign Application Priority Data

May 6, 2015 (TW) .............................. 104114414 A

(51) Int. Cl.
| | | |
|---|---|---|
| G03F 7/039 | (2006.01) | |
| G02B 5/22 | (2006.01) | |
| G03F 7/00 | (2006.01) | |
| G02F 1/1335 | (2006.01) | |
| G03F 7/031 | (2006.01) | |
| G03F 7/032 | (2006.01) | |
| G03F 7/033 | (2006.01) | |
| G03F 7/038 | (2006.01) | |

(52) U.S. Cl.
CPC ....... *G02B 5/223* (2013.01); *G02F 1/133514* (2013.01); *G03F 7/0007* (2013.01); *G03F 7/031* (2013.01); *G03F 7/032* (2013.01); *G03F 7/033* (2013.01); *G03F 7/0388* (2013.01)

(58) Field of Classification Search
CPC .................................................. G03F 7/0007
See application file for complete search history.

(56) References Cited

U.S. PATENT DOCUMENTS

| | | | | |
|---|---|---|---|---|
| 4,258,118 A * | 3/1981 | Foley | ....................... | C09B 11/24 430/221 |
| 4,290,955 A * | 9/1981 | Cincotta | .............. | C07D 311/82 430/221 |
| 2013/0154303 A1* | 6/2013 | Kim | ....................... | B60J 3/0265 296/97.13 |
| 2015/0042931 A1* | 2/2015 | Hsu | ........................ | G02B 5/223 349/106 |
| 2015/0268554 A1* | 9/2015 | Hsu | ....................... | G03F 7/0007 430/285.1 |
| 2016/0040013 A1* | 2/2016 | Shida | .................... | C07C 309/30 526/266 |
| 2016/0122456 A1* | 5/2016 | Li | ......................... | C08F 222/10 430/270.1 |
| 2016/0327858 A1* | 11/2016 | Sasaki | ................... | G03F 7/0007 |

FOREIGN PATENT DOCUMENTS

| | | |
|---|---|---|
| JP | H05306266 | 11/1993 |
| JP | 2012022048 | 2/2012 |
| JP | 2015028144 | 2/2015 |
| JP | 2015519411 | 7/2015 |
| TW | 201421159 | 6/2014 |
| TW | 201502703 | 1/2015 |
| WO | 2014126167 | 8/2014 |
| WO | WO 2016/058551 A1 * | 4/2016 |

OTHER PUBLICATIONS

English translation of JP, 2015-028144 a, A (2015) from machine translation from AIPN Japan Patent Office National Center for Industrial Property Information and Training, generated Jun. 25, 2017, 138 pages.*
English translation of Notification of Reason for Refusal in Japanese patent application No. 2016-093488, dated May 30, 2017 for which the Japanese version was presented by applicants. Three pages obtained via PE2E application at USPTO.*
"OfficeAction of Japan Counterpart Application," dated May 30, 2017, p. 1-p. 4.
"Office Action of Taiwan Counterpart Application," dated Aug. 16, 2017, p. 1-p. 7.

* cited by examiner

*Primary Examiner* — Cynthia Hamilton
(74) *Attorney, Agent, or Firm* — JCIPRNET

(57) ABSTRACT

The present invention relates to a photosensitive resin composition for a color filter and an application of the same. The photosensitive resin composition includes an alkali-soluble resin (A), a compound (B) having an ethylenically unsaturated group, a photoinitiator (C), an organic solvent (D) and a pigment (E). The alkali-soluble resin (A) includes a first alkali-soluble resin (A-1) having the structure represented by formula (1). The aforementioned photosensitive resin composition is advantageously applied for the color filer with better contrast.

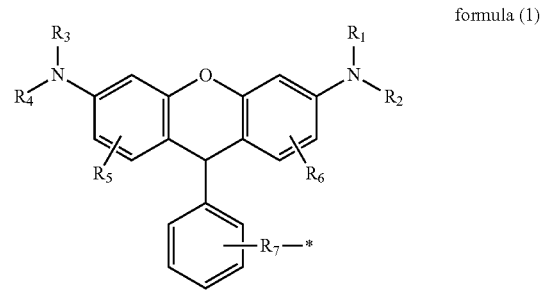

formula (1)

13 Claims, 1 Drawing Sheet

PHOTOSENSITIVE RESIN COMPOSITION FOR COLOR FILTER AND APPLICATION OF THE SAME

CROSS-REFERENCE TO RELATED APPLICATION

This application claims the priority benefit of Taiwan application serial no. 104114414, filed on May 6, 2015. The entirety of the above-mentioned patent application is hereby incorporated by reference herein and made a part of this specification.

BACKGROUND OF THE INVENTION

1. Field of the Invention

The present invention generally relates to a photosensitive resin composition for color filter and a color filter using the same. In particular, the invention provides a photosensitive resin composition for color filter having a high contrast.

2. Description of Related Art

Currently, the color filter has been widely used in applications such as color liquid crystal displays, color fax machines, and color cameras. Moreover, with the ever expanding market demand for imaging equipment such as the color liquid crystal display, the production techniques of the color filter are also diversifying so as to meet the need of the market demand.

The color filter is generally manufactured by forming, for instance, red, green, and blue pixels on a transparent glass substrate via a method such as dyeing, printing, electro-deposition, or pigment dispersion. Generally, to further increase the contrast of the color filter, a light-shielding layer (also referred to as a black matrix) can further be disposed between pixel color layers formed by the pixels.

Furthermore, a pigment ratio of the photosensitive resin composition is increased with the requirement of higher contrast and color saturation. However, as the pigments have a specific particle size that may result in light scattering, the contrast may also be easily decreased. In addition, with a higher usage amount of the pigment, a relatively amount of an alkali-soluble resin and a photosensitive monomer is decreased, this may result in insufficient cross-linking after exposure, thereby a problem of poor development resistance may occur. Therefore, how to improve the contrast of the liquid crystal display device while having good development resistance is a problem that needs to be solved.

SUMMARY OF THE INVENTION

Accordingly, the present invention provides a photosensitive resin composition for a color filter, wherein the photosensitive resin composition can be used to solve the problem of a low contrast.

The present invention provides a photosensitive resin composition including an alkali soluble resin (A), a compound (B) containing an ethylenically unsaturated group, a photoinitiator (C), an organic solvent (D) and a pigment (E). Herein, the alkali soluble resin (A) includes a first alkali soluble resin (A-1) having the structure represented by formula (1);

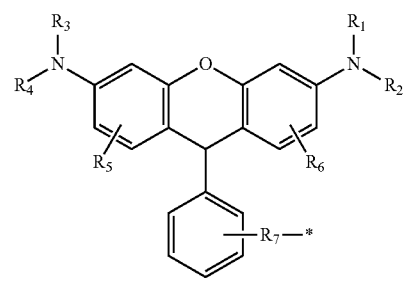

formula (1)

in formula (1), $R_1$, $R_2$, $R_3$ and $R_4$ each independently represents a hydrogen, a $C_1$ to $C_8$ alkyl group, a $C_3$ to $C_8$ cycloalkyl group or phenyl group, wherein the alkyl group, the cycloalkyl group and the phenyl group may be substituted; $R_5$ and $R_6$ each independently represents a hydrogen, a $C_1$ to $C_8$ alkyl group or chlorine; $R_7$ represents a divalent organic group; * represents a bonding position.

In an embodiment of the invention, the divalent organic group $R_7$ in the first alkali soluble resin (A-1) is represented by the following formula:

-Xa-Xb-*- wherein, Xa represents a single bond or methylene; Xb represents

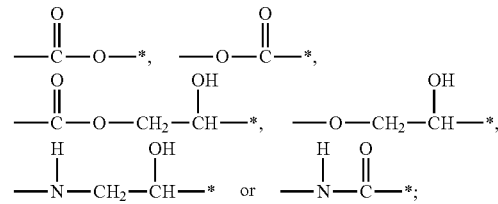

* represents a bonding position.

In an embodiment of the invention, a manufacturing method of the first alkali soluble resin (A-1) is obtained by the reaction between a xanthene derivative (a1) including a first reactive group and a reactive resin (a2) including a second reactive group, wherein the first reactive group and the second reactive group cannot be the same group.

In an embodiment of the invention, the xanthene derivative (a1) including the first reactive group is represented by formula (2):

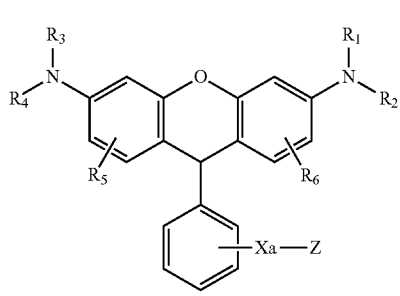

formula (2)

in formula (2), Xa represents a single bond or methylene; Z represent —COOH, —OH or —NH$_2$.

In an embodiment of the invention, the reactive resin (a2) including the second reactive group is a copolymer obtained by the polymerization of an ethylenically unsaturated monomer (i-1) having at least one carboxylic acid group and an ethylenically unsaturated monomer (i-2) having an epoxy group.

In an embodiment of the invention, the reactive resin (a2) including the second reactive group is a copolymer obtained by the polymerization reaction of an epoxy resin (ii-1) having at least two epoxy groups and a compound (ii-2) having at least one carboxylic acid group and at least one ethylenically unsaturated group.

In an embodiment of the invention, the epoxy resin (ii-1) having at least two epoxy groups is represented by formula (3):

formula (3)

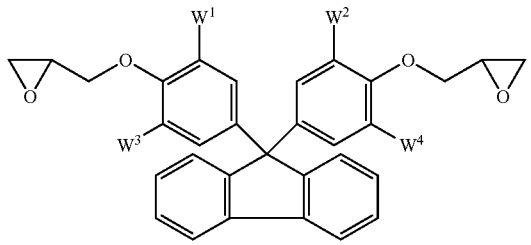

in formula (3), $W^1$, $W^2$, $W^3$ and $W^4$ are respectively the same or different and represent a hydrogen atom, a halogen atom, a $C_1$ to $C_5$ alkyl group, a $C_1$ to $C_5$ alkoxy group, a $C_6$ to $C_{12}$ aryl group, or a $C_6$ to $C_{12}$ aralkyl group.

In an embodiment of the invention, the epoxy resin (ii-1) having at least two epoxy groups is represented by formula (4):

formula (4)

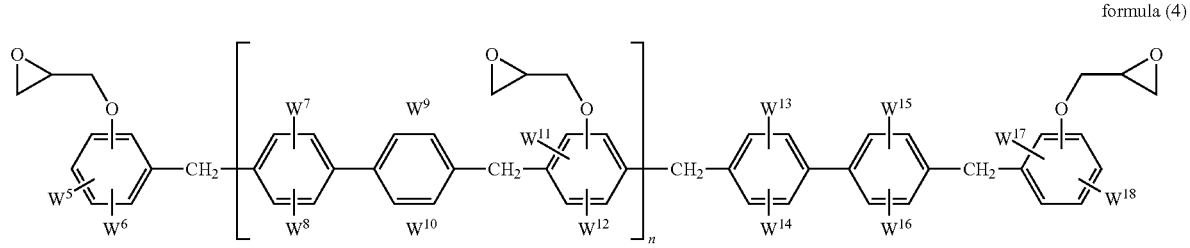

in formula (4), $W^5$ to $W^{18}$ are respectively the same or different and represent a hydrogen atom, a halogen atom, a $C_1$-$C_8$ alkyl group, and a $C_6$-$C_{15}$ aryl group; and n represents an integer ranging from 0 to 10.

In an embodiment of the invention, the photoinitiator (C) includes an O-acyloxime photoinitiator (C-1).

In an embodiment of the invention, based on 100 parts by weight of the alkali soluble resin (A), an amount of the first alkali soluble resin (A-1) is 30 parts by weight to 100 parts by weight.

In an embodiment of the invention, based on 100 parts by weight of the alkali soluble resin (A), an amount of the compound (B) containing an ethylenically unsaturated group is 50 parts by weight to 500 parts by weight, an amount of the photoinitiator (C) is 10 parts by weight to 100 parts by weight, an amount of the organic solvent (D) is 1000 parts by weight to 10000 parts by weight, and an amount of the pigment (E) is 100 parts by weight to 1000 parts by weight.

The present invention also provides a manufacturing method for a color filter, using the photosensitive resin composition mentioned above to form a pixel layer.

The present invention also provides a color filter, formed by the manufacturing method for a color filter mentioned above.

The present invention also provides a liquid crystal display device, including the color filter mentioned above.

Based on the above, the photosensitive resin composition of the present invention includes a first alkali soluble resin (A-1), hence, can be used to solve the problem of a low contrast of the color filter.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Photosensitive Resin Composition

Figure 1:
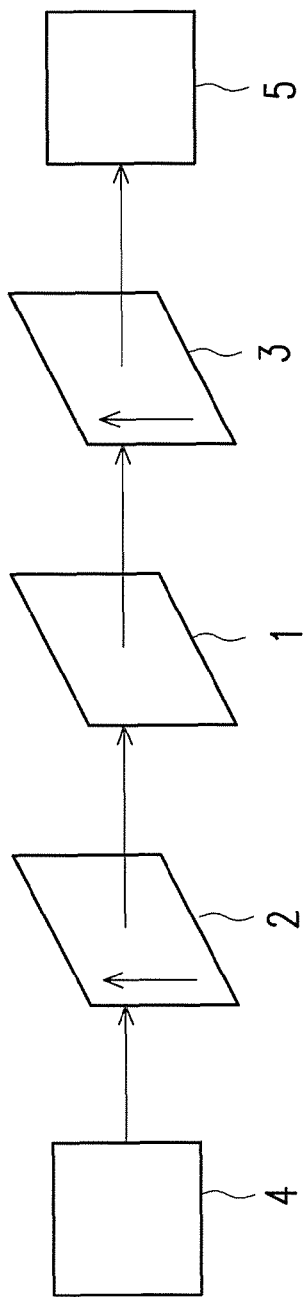
FIG. 1 is a schematic diagram of a photosensitive resin layer contrast measurement status (1).

The invention provides a photosensitive resin composition, including an alkali soluble resin (A), a compound (B) containing an ethylenically unsaturated group, a photoinitiator (C), an organic solvent (D) and a pigment (E). In the following, each component used in the photosensitive resin composition of the invention is described in detail.

It should be mentioned that, in the following, (meth) acrylic acid represents acrylic acid and/or methacrylic acid, and (meth)acrylate represents acrylate and/or methacrylate; similarly, (meth)acryloyl group represents an acryloyl group and/or a methacryloyl group.

Alkali Soluble Resin (A):

The alkali soluble resin (A) comprises a first alkali soluble resin (A-1) and a second alkali soluble resin (A-2).

First Alkali Soluble Resin (A-1):

The alkali soluble resin (A) comprises a first alkali soluble resin (A-1) having the structure represented by formula (1);

formula (1)

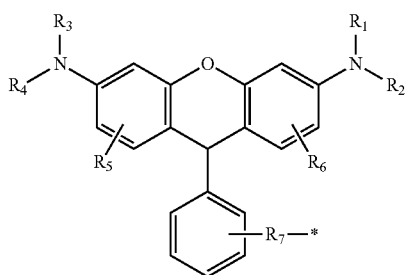

in formula (1), $R_1$, $R_2$, $R_3$ and $R_4$ each independently represents a hydrogen, a $C_1$ to $C_8$ alkyl group, a $C_3$ to $C_8$ cycloalkyl group or phenyl group, wherein the alkyl group, the cycloalkyl group and the phenyl group may be substituted; $R_5$ and $R_6$ each independently represents a hydrogen, a $C_1$ to $C_8$ alkyl group or chlorine; $R_7$ represents a divalent organic group; * represents a bonding position.

The divalent organic group $R_7$ in the first alkali soluble resin (A-1) is represented by the following formula:

-Xa-Xb-*- wherein, Xa represents a single bond or methylene; Xb represents

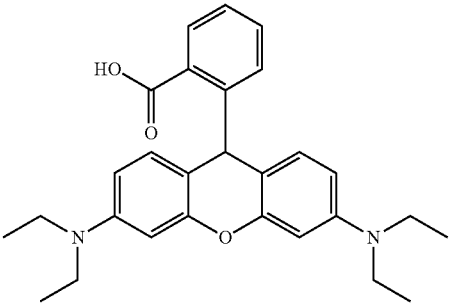

* represents a bonding position.

The manufacturing method of the first alkali soluble resin (A-1) is obtained by the reaction between a xanthene derivative (a1) comprising a first reactive group and a reactive resin (a2) comprising a second reactive group, wherein the first reactive group and the second reactive group cannot be the same group.

The xanthene derivative (a1) comprising the first reactive group is represented by formula (2):

formula (2)

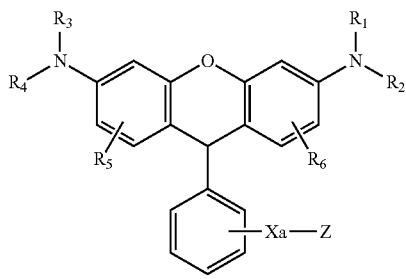

in formula (2), Xa represents a single bond or methylene; Z represent —COOH, —OH or —NH$_2$.

Specific examples of the xanthene derivative (a1) comprising the first reactive group may include xanthene derivative comprising carboxylic acid groups, xanthene derivative comprising hydroxyl groups, and xanthene derivative comprising amine groups.

Specific examples of the xanthene derivative comprising carboxylic acid groups include compounds represented by the following formula.

Formula (2-1)

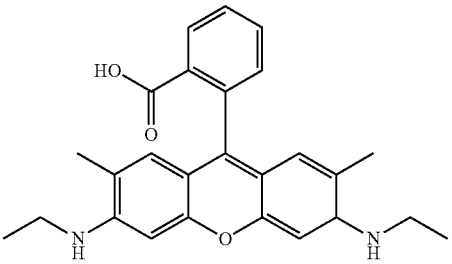

Formula (2-2)

Formula (2-3)

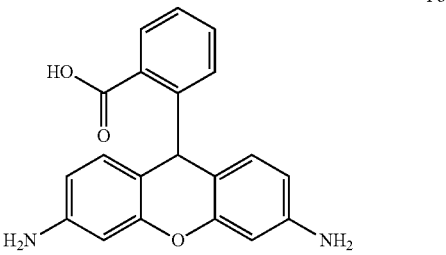

Formula (2-4)

Formula (2-5)

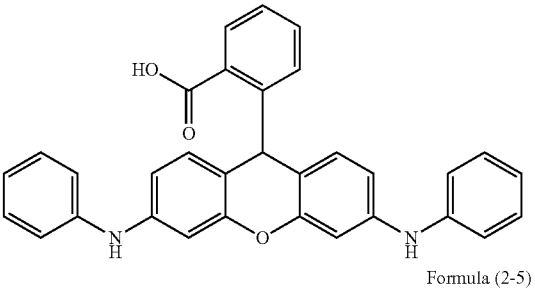

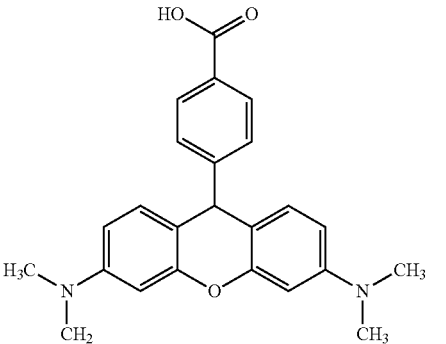

Formula (2-6)
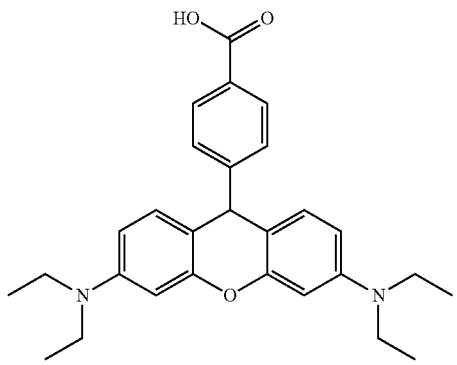
Specific examples of the xanthene derivative comprising hydroxyl groups include compounds represented by the following formula.
Formula (2-7)
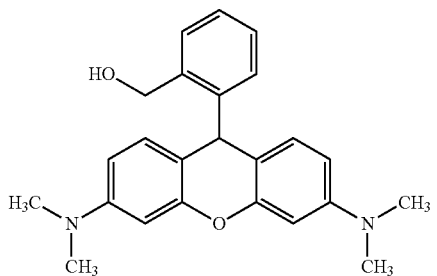
Formula (2-8)
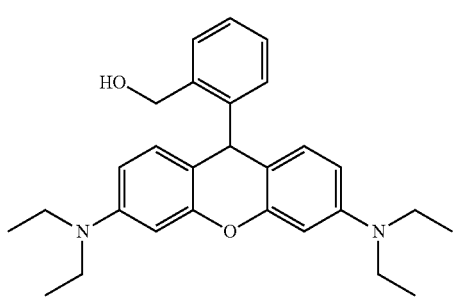
Formula (2-9)
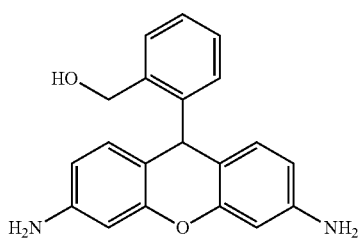
Formula (2-10)
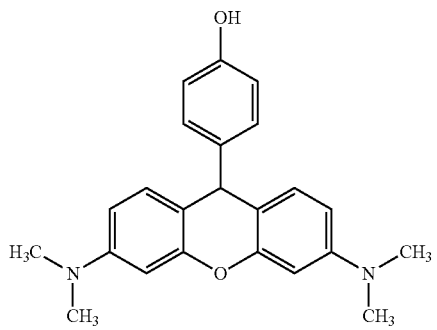
Formula (2-11)
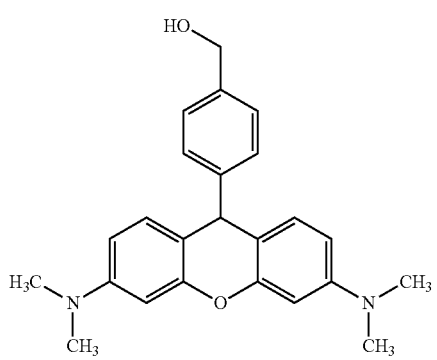
Formula (2-12)
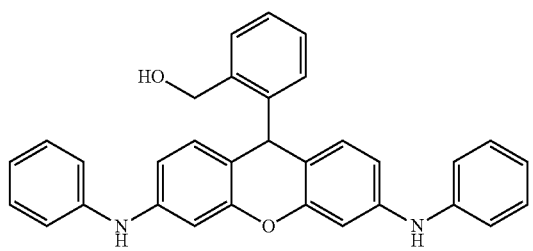
Specific examples of the xanthene derivative comprising amine groups include compounds represented by the following formula.
Formula (2-13)
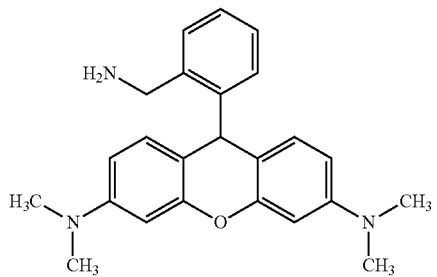

Formula (2-14)

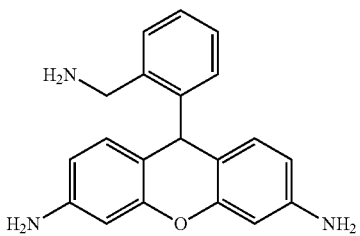

Formula (2-15)

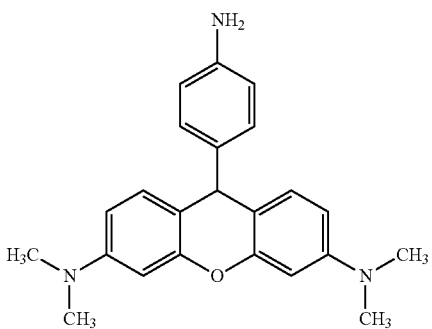

The reactive resin (a2) comprising the second reactive group is a copolymer obtained by the polymerization of an ethylenically unsaturated monomer (i-1) having at least one carboxylic acid group and an ethylenically unsaturated monomer (i-2) having an epoxy group. Furthermore, the reactive resin (a2) comprising the second reactive group can selectively be obtained by the polymerization with other copolymerizable ethylenically unsaturated monomer (i-3).

Specific examples of the ethylenically unsaturated monomer (i-1) having at least one carboxylic acid group includes: unsaturated monocarboxylic acids such as acrylic acid, methacrylic acid (MAA in short), 2-acryloyloxyethyl succinate monoester, 2-methacryloyloxyethyl succinate monoester (HOMS in short), 2-acryloyloxyethyl phthalate, 2-methacryloyloxyethyl phthalate, butenoic acid, α-chloroacrylic acid, ethyl acrylic acid, and cinnamic acid; unsaturated dicarboxylic acids (anhydride) such as maleic acid, maleic anhydride, fumaric acid, itaconic acid, itaconic anhydride, citraconic acid, or citraconic anhydride; and unsaturated polycarboxylic acid compounds having three or more carboxylic acid groups or an anhydride thereof. In the examples above, methacrylic acid and 2-methacryloyloxyethyl succinate monoester are more preferred. The ethylenically unsaturated monomer (i-1) having at least one carboxylic acid group can be used alone or in multiple combinations.

Specific examples of the ethylenically unsaturated monomer (i-2) having an epoxy group includes: unsaturated carboxylic acid glycidyl esters such as glycidyl acrylate, glycidyl methacrylate (GMA in short); unsaturated carboxylic acid oxetanyl esters such as (3-ethyl-3-oxetanyl) acrylate methoxymethyl ester, (3-ethyl-3-oxetanyl) methacrylate methoxymethyl ester (OXMA in short); unsaturated glycidyl ethers such as allyl glycidyl ether, methallyl glycidyl ether. The ethylenically unsaturated monomer (i-2) having an epoxy group can be used alone or in multiple combinations.

Specific examples of other copolymerizable ethylenically unsaturated monomer (i-3) include: aromatic vinyl group compounds such as styrene, α-methylstyrene, vinyltoulene, chlorostyrene, and methoxystyrene; maleimides such as N-phenylmaleimide, N-o-hydroxyphenyl maleimide, N-m-hydroxyphenyl maleimide, N-p-hydroxyphenyl maleimide, N-o-methylphenyl maleimide, N-m-methylphenyl maleimide, N-p-methylphenyl maleimide, N-o-methoxyphenyl maleimide, N-m-methoxyphenyl maleimide, N-p-methoxyphenyl maleimide, and N-cyclohexylmaleimide; unsaturated carboxylic acid esters such as ethyl acrylate, ethyl methacrylate, n-propyl acrylate, n-propyl methacrylate, iso-propyl acrylate, iso-propyl methacrylate, n-butyl acrylate, n-butyl methacrylate, iso-butyl acrylate, iso-butyl methacrylate, sec-butyl acrylate, sec-butyl methacrylate, t-butyl acrylate, t-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, phenyl acrylate, phenyl methacrylate, methoxy triethylene glycol acrylate, methoxy triethylene glycol methacrylate, lauryl methacrylate, tetradecyl methacrylate, cetylmethacrylate, octadecylmethacrylate, eicosylmethacrylate, docosylmethacrylate, and dicyclopentenyloxyethyl acrylate; N,N-dimethyl aminoethyl acrylate, N,N-dimethyl aminoethyl methacrylate, N,N-diethyl aminopropyl acrylate, N,N-dimethyl aminopropyl methacrylate, N,N-dibutyl aminopropyl acrylate, and N,t-butyl aminoethyl methacrylate; carboxylic acid vinyl esters such as vinyl acetate, vinyl propionate, and vinyl butyrate; unsaturated ethers such as methyl vinyl ether, ethyl vinyl ether; vinyl cyanide compounds such as acrylonitrile, methacrylonitrile, α-chloroacrylonitrile, and vinylidene cyanide; unsaturated amides such as acrylamide, methacrylamide, α-chloro acrylamide, N-hydroxyethyl acrylamide, and N-hydroxyethyl methacrylamide; aliphatic conjugated dienes such as 1,3-butadiene, isoamylene, and chlorinated butadiene. The other copolymerizable ethylenically unsaturated monomer (i-3) can be used alone or in multiple combinations.

During the manufacture of the reactive resin (a2) comprising the second reactive group described above, the solvents generally used are such as ethylene glycol monopropyl ether, diethylene glycol dimethyl ether, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether acetate, propylene glycol ethyl ether acetate, propylene glycol propyl ether acetate, ethyl 3-ethoxy propionate, methyl ethyl ketone and acetone. Out of the above, the solvent is preferably diethylene glycol dimethyl ether, propylene glycol methyl ether acetate and ethyl 3-ethoxy propionate, and the solvents may be used alone or in multiple combinations.

The initiators used for the reactive resin (a2) comprising the second reactive group described above are generally free radical polymerization initiators, which can be exemplified as follows: azo compounds, such as 2,2'-azobisisobutyronitrile, 2,2'-azobis-(2,4-dimethylvaleronitrile), 2,2'-azobis-(4-methoxy-2,4-dimethylvaleronitrile), 2,2'-azobis-2-methyl-butyronitrile and the like; and peroxide, such as benzoyl peroxide and the like.

Based on a total amount of the ethylenically unsaturated monomer (i-1) having at least one carboxylic acid group, the ethylenically unsaturated monomer (i-2) having an epoxy group and the other copolymerizable ethylenically unsaturated monomer (i-3) being 100 parts by weight, an amount of the ethylenically unsaturated monomer (i-1) having at least one carboxylic acid group is 20 parts by weight to 50 parts by weight, preferably 25 parts by weight to 45 parts by weight, more preferably 30 parts by weight to 40 parts by weight, an amount of the ethylenically unsaturated monomer (i-2) having an epoxy group is 20 parts by weight to 80 parts by weight, preferably 30 parts by weight to 75 parts by weight, more preferably 40 parts by weight to 70 parts by weight; and an amount of the other copolymerizable ethylenically unsaturated monomer (i-3) is 0 parts by weight to 30 parts by weight, preferably 0 parts by weight to 25 parts by weight, more preferably 0 parts by weight to 20 parts by weight.

Furthermore, the number average molecular weight of the reactive resin (a2) comprising the second reactive group measured by Gel Permeation Chromatography (GPC) based on the polystyrene standard is preferably 3,000 to 30,000, more preferably 5,000 to 25,000.

In addition, the reactive resin (a2) comprising the second reactive group can also be a copolymer obtained by the polymerization reaction of an epoxy resin (ii-1) having at least two epoxy groups and a compound (ii-2) having at least one carboxylic acid group and at least one ethylenically unsaturated group. Furthermore, the reactive resin (a2) comprising the second reactive group can selectively comprise carboxylic acid anhydride compound (ii-3) and/or compound (ii-4) containing epoxy groups.

Epoxy Resin (ii-1) Having at Least Two Epoxy Groups

The epoxy resin (ii-1) having at least two epoxy groups is represented by formula (3):

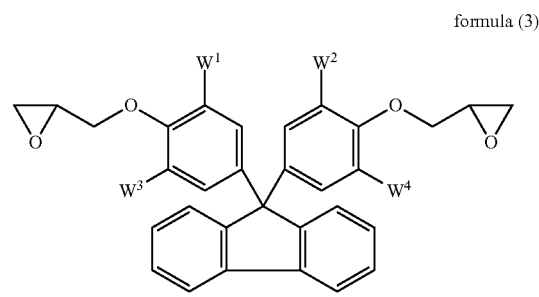

formula (3)

in formula (3), $W^1$, $W^2$, $W^3$ and $W^4$ are respectively the same or different and represent a hydrogen atom, a halogen atom, a $C_1$ to $C_5$ alkyl group, a $C_1$ to $C_5$ alkoxy group, a $C_6$ to $C_{12}$ aryl group, or a $C_6$ to $C_{12}$ aralkyl group.

The compound represented by formula (3) is a bisphenol fluorene compound having an expoxy group that can be obtained by reacting a bisphenol fluorene compound with an epihalohydrin, but is not limited thereto.

In particular, specific examples of the bisphenol fluorene compound may include but are not limited to: 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis (4-hydroxy-3,5-dimethylphenyl)fluorene, 9,9-bis(4-hydroxy-3,5-dichlorophenyl) fluorene, 9,9-bis(4-hydroxy-3,5-dibromophenyl)fluorine or a similar compound thereof.

Specific examples of the epihalohydrin may include but are not limited to epichlorohydrin, epibromohydrin or a similar compound thereof.

Specific examples of the bisphenol fluorene-type compound having an epoxy group obtained by reacting a bisphenol fluorene compound with an epihalohydrin may include but are not limited to products made by Nippon Steel Chemical Co., Ltd. such as ESF-300; products made by Osaka Gas Co., Ltd. such as PG-100, EG-210; and products made by S.M.S. Technology Co., Ltd. such as SMS-F9PhPG, SMS-F9CrG, SMS-F914PG.

The epoxy resin (ii-1) having at least two epoxy groups can also be a structure represented by formula (4):

formula (4)

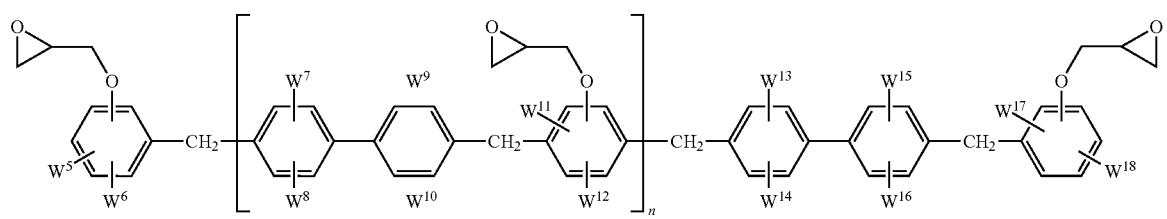

in formula (4), $W^5$ to $W^{18}$ are respectively the same or different and represent a hydrogen atom, a halogen atom, a $C_1$-$C_8$ alkyl group, and a $C_6$-$C_{15}$ aryl group; and n represents an integer ranging from 0 to 10.

The epoxy resin (ii-1) having the structure represented by formula (4) can be obtained by reacting a compound represented by formula (4-1) and the epihalohydrin in the presence of an alkali metal hydroxide:

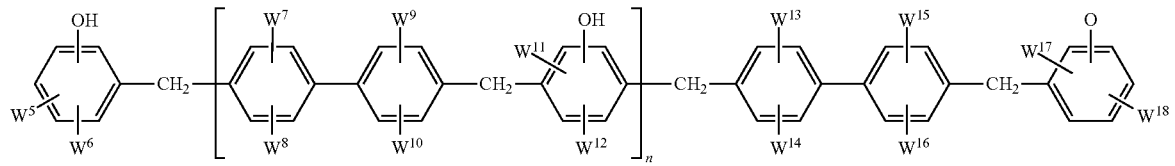

Formula (4-1)

In formula (4-1), the definition of each of $W^5$ to $W^{18}$ and n is the same as mentioned above, and is not repeated herein.

Furthermore, for the epoxy resin (ii-1) having at least two epoxy groups as represented by formula (4), a condensation reaction is performed on a compound represented by formula (4-2) and a phenol in the presence of an acid catalyst to form the compound represented by formula (4-1). Then, an excess amount of the epihalohydrin is added to perform a dehydrohalogenation reaction to obtain the epoxy resin (ii-1) having at least two epoxy groups as represented by formula (4).

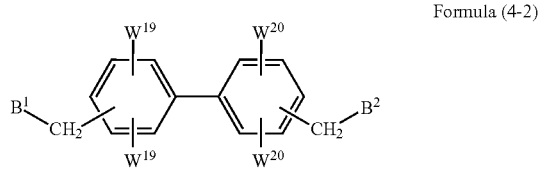

Formula (4-2)

In formula (4-2), $W^{19}$ and $W^{20}$ each independently represents a hydrogen atom, a halogen atom, a $C_1$-$C_8$ alkyl group, or a $C_6$-$C_{15}$ aryl group. $B^1$ and $B^2$ each independently represent a halogen atom, a $C_1$ to $C_6$ alkyl group, or a $C_1$ to $C_6$ alkoxy group. The halogen atom can be chlorine or bromine. The alkyl group is preferably a methyl group, an ethyl group, or a t-butyl group. The alkoxy group is preferably a methoxy group or an ethoxy group.

Specific examples of phenol include: phenol, cresol, ethylphenol, n-propylphenol, isobutylphenol, t-butylphenol, octylphenol, nonylphenol, xylenol, methylbutylphenol, di-t-butylphenol, vinylphenol, propenylphenol, ethinylphenol, cyclopentylphenol, cyclohexylphenol, cyclohexylcresol, or a similar compound thereof. The phenol can be used alone or in multiple combinations.

Based on an amount of 1 mole of the compound represented by formula (4-2), the amount of the phenol is 0.5 moles to 20 moles, preferably 2 moles to 15 moles.

Specific examples of the acid catalyst include: hydrochloric acid, sulfuric acid, p-toluenesulfonic acid, oxalic acid, boron trifluoride, aluminium chloride anhydrous, zinc chloride, or a similar compound thereof. The acid catalyst is preferably p-toluenesulfonic acid, sulfuric acid, hydrochloric acid, or a combination of the compounds. The acid catalyst can be used alone or in multiple combinations.

Moreover, although the amount of the acid catalyst is not particularly limited, based on an amount of 100 wt % of the compound represented by formula (4-2), the amount of the acid catalyst is preferably 0.1 wt % to 30 wt %.

The condensation reaction can be performed without a solvent or in the presence of an organic solvent. Moreover, specific examples of the organic solvent include: toluene, xylene, methyl isobutyl ketone, or a similar compound thereof. The organic solvent can be used alone or in multiple combinations.

Based on a total weight of 100 parts by weight of the compound represented by formula (4-2) and the phenol, the amount of the organic solvent is 50 parts by weight to 300 parts by weight, preferably 100 parts by weight to 250 parts by weight. Moreover, the operating temperature of the condensation reaction is 40° C. to 180° C. and the operating time of the condensation reaction is 1 hour to 8 hours.

After the condensation reaction is complete, a neutralization treatment or a rinse treatment can be performed. In the neutralization treatment, the pH value of the reacted solution is adjusted to pH 3 to pH 7, preferably pH 5 to pH 7. The rinse treatment can be performed by using a neutralizer, wherein the neutralizer is an alkaline substance, and specific examples thereof include: an alkali metal hydroxide such as sodium hydroxide, potassium hydroxide, or a similar compound thereof; an alkaline earth metal hydroxide such as calcium hydroxide, magnesium hydroxide, or a similar compound thereof; an organic amine such as diethylene triamine, triethylenetetramine, aniline, phenylene diamine, or a similar compound thereof; and ammonia, sodium dihydrogen phosphate, or a combination of the compounds. The neutralizer can be used alone or n multiple combinations. The rinse treatment can be performed with a known method, such as adding an aqueous solution containing a neutralizer in the reacted solution and then extracting repeatedly. After the neutralization treatment or the rinse treatment, the unreacted phenol and solvent can be distilled off by a heat treatment under reduced pressure, and then condensation is performed to obtain the compound represented by formula (4-1).

Specific examples of the epihalohydrin include: epichlorohydrin, epibromohydrin, or a combination of the compounds. Before the dehydrohalogenation reaction is performed, an alkali metal hydroxide such as sodium hydroxide or potassium hydroxide can be pre-added or added during the reaction process. The operating temperature of the dehydrohalogenation reaction is 20° C. to 120° C. and the operating time thereof ranges from 1 hour to 10 hours.

In an embodiment, the alkali metal hydroxide added in the dehydrohalogenation reaction can also be an aqueous solution thereof. In the present embodiment, when an aqueous solution of the alkali metal hydroxide is continuously added to the dehydrohalogenation reaction system, water and the epihalohydrin can be continuously distilled under reduced pressure or atmospheric pressure at the same time to separate and remove water, and the epihalohydrin can be continuously flown back into the reaction system.

Before the dehydrohalogenation reaction is performed, a quaternary ammonium salt such as tetramethyl ammonium chloride, tetramethyl ammonium bromide, trimethyl benzyl ammonium chloride, or a similar compound thereof can also be added as a catalyst, and then an alkali metal hydroxide or an aqueous solution thereof is added after the mixture is reacted at 50° C. to 150° C. for 1 hour to 5 hours. Then, the mixture is reacted for 1 hour to 10 hours at a temperature of 20° C. to 120° C. to perform a dehydrohalogenation reaction.

Based on a total equivalent of 1 equivalent of the hydroxyl group in the compound represented by formula (4-1), the amount of the epihalohydrin is 1 equivalent to 20 equivalents, preferably 2 equivalents to 10 equivalents. Based on a total equivalent of 1 equivalent of the hydroxyl group in the compound represented by formula (4-1), the amount of the alkali metal hydroxide added in the dehydrohalogenation reaction is 0.8 equivalents to 15 equivalents, preferably 0.9 equivalents to 11 equivalents.

Moreover, to facilitate the dehydrohalogenation reaction, an alcohol such as methanol, ethanol, or a similar compound thereof can also be added. In addition, an aprotic polar solvent such as dimethyl sulfone, dimethyl sulfoxide, or a similar compound thereof can also be added to perform the reaction. When an alcohol is used, based on a total amount of 100 parts by weight of the epihalohydrin, the amount of the alcohol is 2 parts by weight to 20 parts by weight, preferably 4 parts by weight to 15 parts by weight. When an aprotic polar solvent is used, based on a total amount of 100 parts by weight of the epihalohydrin, the amount of the aprotic polar solvent is 5 parts by weight to 100 parts by weight, preferably 10 parts by weight to 90 parts by weight.

After the dehydrohalogenation reaction is complete, a rinse treatment can be optionally performed. Then, the epihalohydrin, the alcohol, and the aprotic polar solvent are removed by using a method of distillation under reduced pressure at, for instance, a temperature of 110° C. to 250° C. and a pressure of equal to or less than 1.3 kPa (10 mmHg).

To prevent the epoxy resin formed from containing a hydrolyzable halogen, the solution after the dehydrohalogenation reaction can be added in a solvent such as toluene or methyl isobutyl ketone and an aqueous solution of alkali metal hydroxide such as sodium hydroxide or potassium hydroxide, and then the dehydrohalogenation reaction is performed again. In the dehydrohalogenation reaction, based on a total equivalent of 1 equivalent of the hydroxyl group in the compound represented by formula (4-1), the amount of the alkali metal hydroxide is 0.01 moles to 0.3 moles, preferably 0.05 moles to 0.2 moles. Moreover, the operating temperature of the dehydrohalogenation reaction ranges from 50° C. to 120° C. and the operating time thereof ranges from 0.5 hours to 2 hours.

After the dehydrohalogenation reaction is complete, the salts are removed through steps such as filtering and rinsing. Moreover, a method of distillation under reduced pressure is used to remove solvents such as toluene and methyl isobutyl ketone to obtain the compound represented by formula (4). Specific examples of the compound represented by formula (4) include products such as NC-3000, NC-3000H, NC-3000S, and NC-3000P manufactured by Nippon Kayaku Co., Ltd.

Compound (ii-2) Having at Least One Carboxylic Acid Group and at Least One Ethylenically Unsaturated Group The compound (ii-2) having at least one carboxylic acid group and at least one ethylenically unsaturated group are selected from the group consisting of the following (1) to (3): (1) acrylic acid, methacrylic acid, 2-methacryloyloxyethylbutanedioic acid, 2-methacryloyloxybutylbutanedioic acid, 2-methacryloyloxyethylhexanedioic acid, 2-methacryloyloxybutylhexanedioic acid, 2-methacryloyloxyethylhexahydrophthalic acid, 2-methacryloyloxyethylmaleic acid, 2-methacryloyloxypropylmaleic acid, 2-methacryloyloxybutylmaleic acid, 2-methacryloyloxypropylbutanedioic acid, 2-methacryloyloxypropylhexanedioic acid, 2-methacryloyloxypropyltetrahydrophthalic acid, 2-methacryloyloxypropylphthalic acid, 2-methacryloyloxybutylphthalic acid, or 2-methacryloyloxybutylhydrophthalic acid; (2) a compound obtained by reacting (meth)acrylate containing a hydroxyl group with a dicarboxylic acid compound, wherein the dicarboxylic acid compound includes adipic acid, succinic acid, maleic acid, or phthalic acid; and (3) a hemiester compound obtained by reacting (meth)acrylate containing a hydroxyl group with the carboxylic anhydride compound (iii) above, wherein the (meth)acrylate containing a hydroxyl group includes (2-hydroxyethyl) acrylate, (2-hydroxyethyl) methacrylate, (2-hydroxypropyl) acrylate, (2-hydroxypropyl) methacrylate, (4-hydroxybutyl) acrylate, (4-hydroxybutyl) methacrylate, or pentaerythritol trimethacrylate.

Carboxylic Acid Anhydride Compound (ii-3) and Compound (ii-4) Containing Epoxy Groups The reactive resin (a2) comprising the second reactive group can selectively comprise carboxylic acid anhydride compound (ii-3) and/or compound (ii-4) containing epoxy groups.

The carboxylic anhydride compound (ii-3) can be selected from the group consisting of the following (1) to (2): (1) a dicarboxylic anhydride compound such as butanedioic anhydride, maleic anhydride, itaconic anhydride, phthalic anhydride, tetrahydrophthalic anhydride, hexahydrophthalic anhydride, methyl tetrahydrophthalic anhydride, methyl hexahydrophthalic anhydride, methyl endo-methylene tetrahydro phthalic anhydride, chlorendic anhydride, glutaric anhydride, or 1,2,4-benzene tricarboxylic anhydride; and (2) a tetracarboxylic anhydride compound such as benzophenone tetracarboxylic dianhydride (BTDA), biphenyl tetracarboxylic dianhydride, or biphenyl ether tetracarboxylic dianhydride.

The compound (ii-4) containing epoxy groups can be selected from glycidyl methacrylate, 3,4-epoxycyclohexylmethacrylate, a glycidyl ether compound containing an unsaturated group, an unsaturated compound containing an epoxy group, or a combination of the compounds. The glycidyl ether compound containing an unsaturated group includes products made by Nagase Kasei Kogyo Co., Ltd. such as Denacol EX-111, Denacol EX-121, Denacol EX-141, Denacol EX-145, Denacol EX-146, Denacol EX-171, or Denacol EX-192.

The reactive resin (a2) comprising the second reactive group can be a reaction product containing a hydroxyl group formed by performing a polymerization reaction on the epoxy compound (ii-1) having at least two epoxy groups and the compound (ii-2) having at least one carboxylic acid group and at least one ethylenically unsaturated group. In particular, the epoxy compound (ii-1) having at least two epoxy groups is a compound represented by formula (4). Then, the carboxylic anhydride compound (ii-3) is added to the reaction solution to perform a polymerization reaction. Based on a total equivalent of 1 equivalent of the hydroxyl group of the reaction product containing a hydroxyl group, the equivalent of the acid anhydride group contained in the carboxylic anhydride compound (ii-3) is preferably 0.4 equivalents to 1 equivalent, more preferably 0.75 equivalents to 1 equivalent. When a plurality of the carboxylic anhydride compounds (ii-3) is used, the carboxylic anhydride compounds can be added to the reaction in sequence or at the same time. When a dicarboxylic anhydride compound and a tetracarboxylic anhydride compound are used as the carboxylic anhydride compound (ii-3), the molar ratio of the dicarboxylic anhydride compound and the tetracarboxylic anhydride compound is preferably 1/99 to 90/10, more preferably 5/95 to 80/20. Moreover, the operating temperature of the reaction can be 50° C. to 130° C.

When preparing the reactive resin (a2) comprising the second reactive group, to reduce the reaction time, a basic compound is generally added to the reaction solution as a reaction catalyst. The reaction catalyst includes, for instance, triphenyl phosphine, triphenyl stibine, triethylamine, triethanolamine, tetramethylammonium chloride, or benzyltriethylammonium chloride. The reaction catalyst can be used alone or in multiple combinations.

Based on a total amount of 100 parts by weight of the epoxy compound (ii-1) having at least two epoxy groups and the compound (ii-2) having at least one carboxylic acid group and at least one ethylenically unsaturated group, the amount of the reaction catalyst is preferably 0.01 parts by weight to 10 parts by weight, more preferably 0.3 parts by weight to 5 parts by weight.

Moreover, to control the degree of polymerization, a polymerization inhibitor can be added to the reaction solution. The polymerization inhibitor includes, for instance, methoxyphenol, methylhydroquinone, hydroquinone, 2,6-di-t-butyl-p-cresol, or phenothiazine. The polymerization inhibitor can be used alone or in multiple combinations.

Based on a total amount of 100 parts by weight of the epoxy compound (ii-1) having at least two epoxy groups and the compound (ii-2) having at least one carboxylic acid group and at least one ethylenically unsaturated group, the amount of the polymerization inhibitor is preferably 0.01 parts by weight to 10 parts by weight and more preferably 0.1 parts by weight to 5 parts by weight.

When preparing the reactive resin (a2) comprising the second reactive group a polymerization solvent can optionally be used. The polymerization solvent includes an alcohol solvent such as ethanol, propanol, isopropanol, butanol, isobutanol, 2-butanol, hexanol, or ethylene glycol; a ketone solvent such as methyl ethyl ketone or cyclohexanone; an aromatic hydrocarbon solvent such as toluene or xylene; a cellosolve solvent such as cellosolve or butyl cellosolve; a carbitol solvent such as carbitol or butyl carbitol; a propylene glycol alkyl ether solvent such as propylene glycol monomethyl ether; a poly(propylene glycol) alkyl ether solvent such as di(propylene glycol) methyl ether; an acetate solvent such as ethyl acetate, butyl acetate, ethylene glycol monoethyl ether acetate, or propylene glycol monomethyl ether acetate; an alkyl lactate solvent such as ethyl lactate or butyl lactate; or a dialkyl glycol ether solvent. The polymerization solvent can be used alone or in multiple combinations.

Furthermore, the number average molecular weight of the reactive resin (a2) comprising the second reactive group measured by Gel Permeation Chromatography (GPC) based on the polystyrene standard is preferably 800 to 8,000, more preferably 1,000 to 6,000.

The synthesis of the first alkali-soluble resin (A-1) can be performed by a conventional method known in the art, for example, by mixing the reactive resin (a2) comprising the second reactive group with the xanthene derivative (a1) comprising the first reactive group and undergoing polymerization to obtain the product.

In the photosensitive resin composition of the present invention, based on an amount of 100 parts by weight of the alkali-soluble resin (A), the amount of the first alkali-soluble resin (A-1) is 30 parts by weight to 100 parts by weight, preferably 40 parts by weight to 100 parts by weight, more preferably 50 parts by weight to 100 parts by weight. When the photosensitive resin composition does not include the first alkali-soluble resin (A-1), then the contrast is poor.

Second Alkali-Soluble Resin (A-2)

The alkali-soluble resin (A) may selectively include a second alkali-soluble resin (A-2). The second alkali-soluble resin (A-2) includes but is not limited to a resin containing carboxylic acid groups or hydroxyl groups. Specific examples may include: acrylic based resin other than the resin having an unsaturated group, urethane based resin and novolac based resin.

In the photosensitive resin composition of the present invention, based on an amount of 100 parts by weight of the alkali-soluble resin (A), the amount of the second alkali-soluble resin (A-2) is 0 parts by weight to 70 parts by weight, preferably 0 parts by weight to 60 parts by weight, more preferably 0 parts by weight to 50 parts by weight.

Compound (B) Containing an Ethylenically Unsaturated Group

The compound (B) containing an ethylenically unsaturated group is an ethylenically unsaturated compound containing at least one or more ethylenically unsaturated groups. Specific examples may include, but are not limited to: ethylenically unsaturated compound containing one ethylenically unsaturated group such as acrylamide, (meth)acryloylmorpholine, 7-amino-3,7-dimethyloctyl(meth)acrylate, iso-butoxymethyl(meth)acrylamide, iso-bornyloxyethyl(meth)acrylate, iso-bornyl(meth)acrylate, 2-ethylhexyl(meth)acrylate, ethyl diethylene glycol(meth)acrylate, t-octyl(meth)acrylamide, diacetone(meth)acrylamide, dimethylamino(meth)acrylate, dodecyl(meth)acrylate, dicyclopentenyloxyethyl(meth)acrylate, dicyclopentenyl(meth)acrylate, N,N-dimethyl(meth)acrylamide, tetrachlorophenyl(meth)acrylate, 2-tetrachlorophenoxy ethyl(meth)acrylate, tetrahydrofurfuryl(meth)acrylate, tetrabromophenyl(meth)acrylate, 2-tetrabromophenoxyethyl(meth)acrylate, 2-trichlorophenoxyethyl(meth)acrylate, tribromophenyl(meth)acrylate, 2-tribromophenoxyethyl(meth)acrylate, 2-hydroxyethyl(meth)acrylate, 2-hydroxypropyl(meth)acrylate, vinylcaprolactam, N-vinylpyrrolidone, phenoxyethyl(meth)acrylate, pentachlorophenyl(meth)acrylate, pentabromophenyl(meth)acrylate, polyethylene glycol mono(meth)acrylate, polypropylene glycol mono(meth)acrylate, bornyl(meth)acrylate; ethylenically unsaturated compound containing two ethylenically unsaturated groups such as ethylene glycol di(meth)acrylate, dicyclopentenyldi(meth)acrylate, triethylene glycol di(meth)acrylate, tetraethylene glycol di(meth)acrylate, tri(2-hydroxyethyl) isocyanurate di(meth)acrylate, triptopylene glycol di(meth)acrylate, neo-pentylene glycol di(meth)acrylate, 1,4-butanediol di(meth)acrylate, 1,6-hexanediol di(meth)acrylate, polyester di(meth)acrylate, polyethylene glycol di(meth)acrylate, EO-modified bisphenol A di(meth)acrylate, EO-modified bisphenol F di(meth)acrylate, phenolic polyglycidyl ether(meth)acrylate; ethylenically unsaturated compound containing three ethylenically unsaturated groups such as tri(2-hydroxyethyl) isocyanurate tri(meth)acrylate, caprolactone-modified tri(2-hydroxyethyl) isocyanurate tri(meth)acrylate, trimethylolpropyl tri(meth)acrylate, ethylene oxide (EO in short)-modified trimethylolpropyl tri(meth)acrylate, propylene oxide (PO in short)-modified trimethylolpropyl tri(meth)acrylate, pentaerythritol tri(meth)acrylate, PO-modified glycerol tri(meth)proprionate; ethylenically unsaturated compound containing four ethylenically unsaturated groups such as pentaerythritol tetra(meth)acrylate, dipentaerythritol tetra(meth)acrylate, ditrimethylolpropyl tetra(meth)acrylate; ethylenically unsaturated compound containing five ethylenically unsaturated groups such as dipentaerythritol penta(meth)acrylate, caprolactone-modified dipentaerythritol penta(meth)acrylate; ethylenically unsaturated compound containing six ethylenically unsaturated groups such as dipentaerythritol hexaacrylate (DPHA), dipentaerythritol hexa(meth)acrylate, caprolactone-modified dipentaerythritol hexa(meth)acrylate, ethylene oxide (EO in short)-modified dipentaerythritol hexaacrylate.

Out of the above, it is preferably an ethylenically unsaturated compound containing three or more ethylenically unsaturated groups, more preferably an ethylenically unsaturated compound containing four or more ethylenically unsaturated groups, even more preferably an ethylenically unsaturated compound containing five or more ethylenically unsaturated groups. The ethylenically unsaturated compound (B) containing an ethylenically unsaturated group may be used alone or in multiple combinations.

In general, based on an amount of 100 parts by weight of the alkali-soluble resin (A), the amount of the ethylenically unsaturated compound (B) containing an ethylenically unsaturated group of the present invention is 50 parts by weight to 500 parts by weight, preferably 75 parts by weight to 450 parts by weight, more preferably 100 parts by weight to 400 parts by weight.

Photoinitiator (C)

The photoinitiator (C) includes an O-acyloxime photoinitiator (C-1) and other photoinitiator (C-2).

O-Acyloxime Photoinitiator (C-1)

Specifically, examples of the O-acyloxime photoinitiator (C-1) include 1-[4-(phenylthio)phenyl]-heptane-1,2-dione 2-(O-benzoyloxime), 1-[4-(phenylthio) phenyl]-octane-1,2-dione 2-(O-benzoyloxime), 1-[4-(benzoyl)phenyl]-octane-1,2-dione 2-(O-benzoyloxime), 1-[9-ethyl-6-(2-methylbenzoyl)-9H-carbazol-3-yl]-ethanone 1-(O-acetyloxime), 1-[9-ethyl-6-(3-methylbenzoyl)-9H-carbazol-3-yl]-ethanone 1-(O-acetyloxime), 1-[9-ethyl-6-benzoyl-9H-carbazol-3-yl]-ethanone 1-(O-acetyloxime), ethanone-1-[9-ethyl-6-(2-methyl-4-(tetrahydrofuran)benzoyl)-9H-carbazol-3-yl]-1-(O-acetyloxime), ethanone-1-[9-ethyl-6-(2-methyl-4-(tetrahydropyranyebenzoyl)-9H-carbazol-3-yl]-1-(O-acetyloxime), ethanone-1-[9-ethyl-6-(2-methyl-5-(tetrahydrofuran) benzoyl)-9H-carbazol-3-yl]-1-(O-acetyloxime), ethanone-1-[9-ethyl-6-(2-methyl-5-(tetrahydropyranyl)benzoyl)-9H-carbazol-3-yl]-1-(O-acetyloxime), ethanone-1-[9-ethyl-6-(2-methyl-4-(tetrahydrofuran)methoxybenzoyl)-9H-carbazol-3-yl]-1-(O-acetyloxime), ethanone-1-[9-ethyl-6-(2-methyl-4-(tetrahydropyranyl)methoxybenzoyl)-9H-carbazol-3-yl]-1-(O-acetyloxime), ethanone-1-[9-ethyl-6-(2-methyl-5-(tetrahydrofuran) methoxybenzoyl)-9H-carbazol-3-yl]-1-(O-acetyloxime), ethanone-1-[9-ethyl-6-(2-methyl-5-(tetrahydropyranyl)methoxybenzoyl)-9H-carbazol-3-yl]-1-(O-acetyloxime), ethanone-1-[9-ethyl-6-{2-methyl-4-(2,2-dimethyl-1,3-dioxolan)benzoyl}-9H-carbazol-3-yl]-1-(O-acetyloxime), ethanone-1-[9-ethyl-6-{2-methyl-4-(2,2-dimethyl-1,3-dioxolan) methoxybenzoyl}-9H-carbazol-3-yl]-1-(O-acetyloxime) or the compounds represented by formula (C-1a) to formula (C-1j) shown below. The O-acyloxime photoinitiator (C-1) can be used alone or in multiple combinations.

Formula (C-1a)

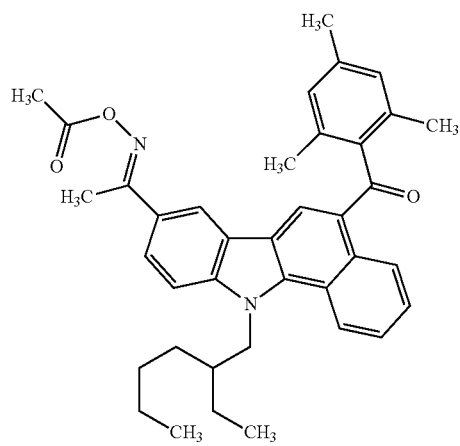

Formula (C-1b)

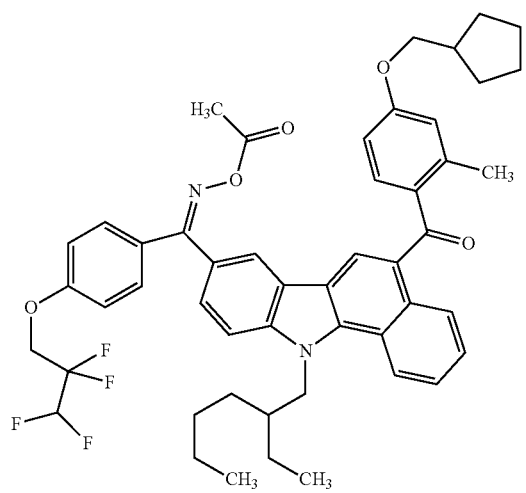

Formula (C-1c)

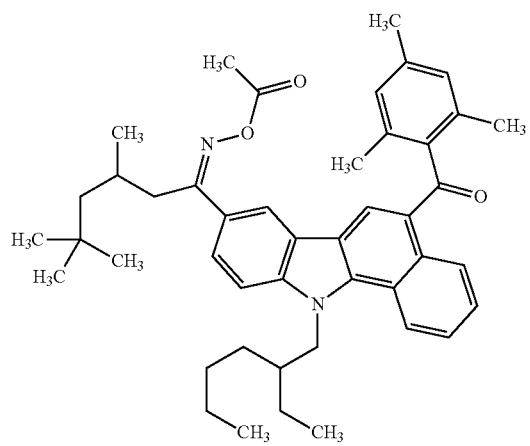

Formula (C-1d)
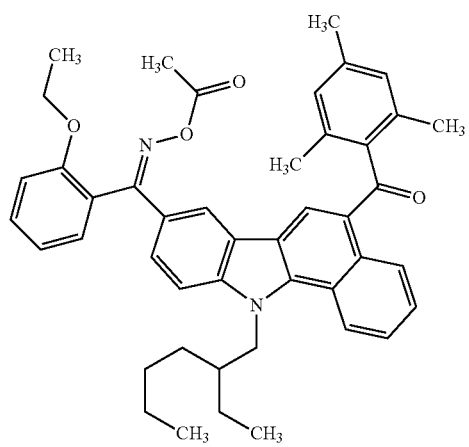
Formula (C-1g)
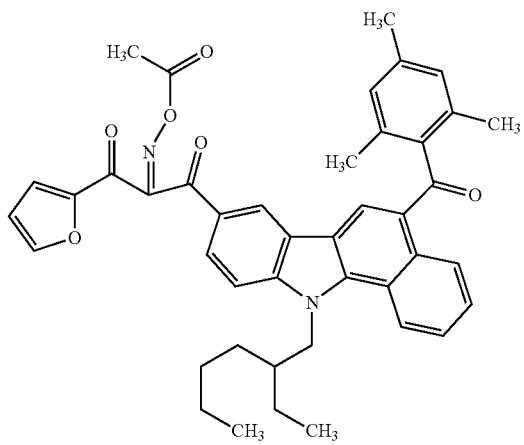
Formula (C-1e)
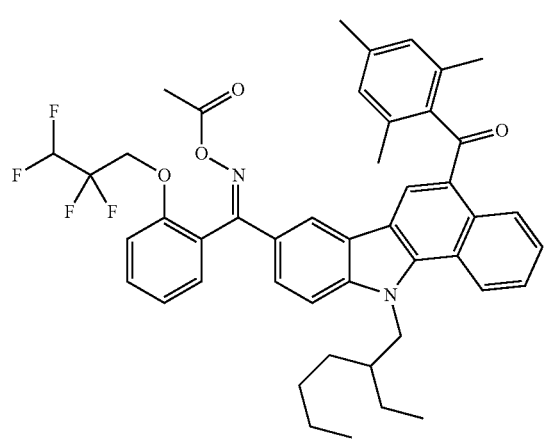
Formula (C-1h)
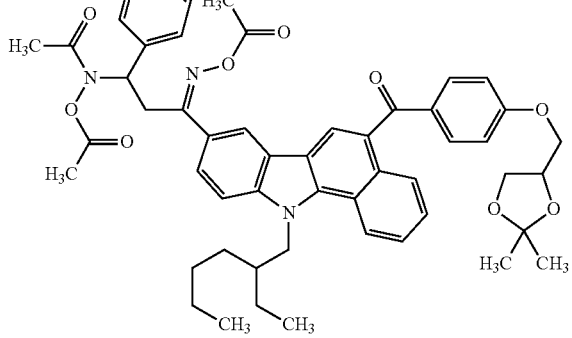
Formula (C-1f)
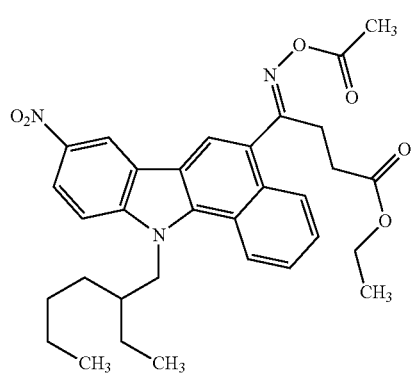
Formula (C-1i)
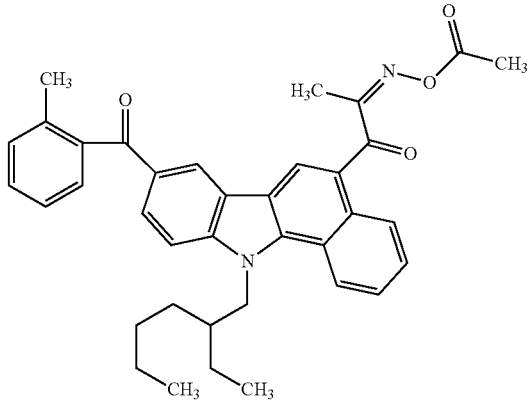

-continued

Formula (C-1j)

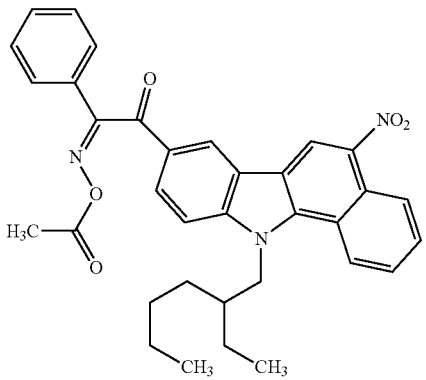

Other Photoinitiator (C-2)

Specific examples of other photoinitiator (C-2) includes triazine based compounds, acetophenone based compounds, biimidazole based compounds, benzophenone based compound, α-diketone based compounds, acyloin based compounds, acyloin ether based compounds, acylphosphineoxide based compounds, quinone based compounds, halogen containing compounds, peroxide, or a combination of the above compounds.

Specific examples of triazine based compounds includes vinyl-halomethyl-s-triazine compounds, 2-(naphth-1-yl)-4,6-bis-halomethyl-s-triazine compounds and 4-(p-aminophenyl)-2,6-di-halomethyl-s-triazine compounds, or the combination of the above.

Specific examples of the above vinyl-halomethyl-s-triazine compounds includes 2,4-bis(trichloromethyl)-6-(p-methoxy)styryl-s-triazine, 2,4-bis(trichloro methyl)-3 (1-p-dimethylaminophenyl-1,3-butadienyl)-s-triazine, 2-trichloromethyl-3-amino-6-(p-methoxy)styryl-s-triazine, or the combination of the above.

Specific examples of the above 2-(naphth-1-yl)-4,6-bis-halomethyl-s-triazine compounds includes 2-(naphtha-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-(4-(2-methoxyethyl-naphtho-1-yl)-4,6-bis-trichloromethyl-s-triazine, 2-(4-(2-ethoxyethyl-naphtho-1-yl)-4,6-bis-trichloromethyl-s-triazine, 2-(4-(2-butoxyethyl-naphtho-1-yl)-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, and 2-(4,5-dimethoxy-naphtho-1-yl)-4,6-bis-trichloromethyl-s-triazine, or the combination of the above.

Specific examples of the above 4-(p-aminophenyl)-2,6-di-halomethyl-s-triazine compounds includes 4-[p-N,N-di(ethoxycarbonylmethyl)aminophenyl]-2,6-di(trichloromethyl)-s-triazine, 4-[o-methyl-p-N,N-di(ethoxycarbonylmethyl) aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl) aminophenyl]-2,6-di(trichloromethyl)-s-triazine, 4-[p-N-chloroethylaminophenyl]-2,6-di(trichloromethyl)-s-triazine, 4-[p-N-ethoxycarbonylmethylaminophenyl]-2,6-di(trichloromethyl)-s-triazine, 4-[p-N,N-di(phenyl) aminophenyl)-2,6-di (trichloromethyl)-s-triazine, 4-[p-N-chloroethylcarbonylaminophenyl]-2,6-di (trichloromethyl)-s-triazine, 4-[p-N-(p-methoxyphenyl) carbonylaminophenyl]-2,6-di(trichloromethyl)-s-triazine, 4-[m-N,N-di(ethoxycarbonylmethyl)aminophenyl]-2,6-di (trichloromethyl)-s-triazine, 4-[m-bromo-p-N,N-di(ethoxycarbonylmethyl) aminophenyl]-2,6-di(trichloromethyl)-s-triazine, 4-[m-chloro-p-N,N-di(ethoxycarbonyl methyeaminophenyl]-2,6-di(trichloromethyl)-s-triazine, 4-[m-fluoro-p-N,N-di (ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di (ethoxycarbonylmethyl)aminophenyl]-2,6-di (trichloromethyl)-s-triazine, 4-[m-fluoro-p-N,N-di (ethoxycarbonylmethyl)aminophenyl]-2,6-di (trichloromethyl)-s-triazine, 4-[o-bromo-p-N,N-di (chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di (chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di (chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di (trichloromethyl)-s-triazine, 4-(m-chloro-p-N-ethoxycarbonylmethylaminophenyl)-2,6-di (trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(m-bromo-p-N-chloroethylaminophenyl)-2,6-di (trichloromethyl)-s-triazine, 4-(m-chloro-p-N-chloroethylaminophenyl)-2,6-di (trichloro methyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, 4-(o-fluoro-p-N-chloroethylaminophenyl)-2,6-di(trichloromethyl)-s-triazine, and 2,4-bis(trichloromethyl)-6-[3-bromo-4-[N,N-di(ethoxycarbonylmethyl)amino]phenyl]-1, 3,5-triazine, or the combination of the above.

The triazine based compound preferably includes 4-[m-bromo-p-N,N-di(ethoxycarbonylmethyl)aminophenyl]-2,6-di(trichloromethyl)-s-triazine, 2,4-bis(trichloromethyl)-6-(p-methoxy)styrl-s-triazine, or the combination of the above. Specific examples of the acetophenone based compounds includes p-dimethylamino-acetophenone, α,α'-dimethoxyazoxy-acetophenone, 2,2'-dimethyl-2-phenyl-acetophenone, p-methoxy-acetophenone, 2-methyl-1-(4-methylthiophenyl)-2-morpholino-1-propanone, 2-benzyl-2-N,N-dimethylamino-1-(4-morpholinophenyl)-1-butanone, or the combination of the above.

The acetophenone based compound can be used alone or in multiple combinations.

The acetophenone based compound preferably includes 2-methyl-1-(4-methylthio phenyl)-2-morpholino-1-propanone, 2-benzyl-2-N,N-dimethylamino-1-(4-morpholinophenyl)-1-butanone, or the combination of the above.

Specific examples of the biimidazole based compounds includes 2,2'-bis(o-chlorophenyl)-4,4',5,5'-tetraphenyl-biimidazole, 2,2'-bis(o-fluorophenyl)-4,4',5,5'-tetraphenyl-biimidazole, 2,2'-bis(o-methylphenyl)-4,4',5,5'-tetraphenyl-biimidazole, 2,2'-bis(o-methoxyphenyl)-4,4',5,5'-tetraphenyl-biimidazole, 2,2'-bis(o-ethylphenyl)-4,4',5,5'-tetraphenyl-biimidazole, 2,2'-bis(p-methoxyphenyl)-4,4',5,5'-tetraphenyl-biimidazole, 2,2'-bis(2,2',4,4'-tetramethoxyphenyl)-4,4',5,5'-tetraphenyl-biimidazole, 2,2'-bis(2-chlorophenyl)-4,4',5,5'-tetraphenyl-biimidazole, 2,2'-bis(2,4-dichlorophenyl)-4,4',5,5'-tetraphenyl-biimidazole, or the combination of the above.

The biimidazole based compound can be used alone or in multiple combinations.

The biimidazole based compound is preferably 2,2'-bis(2,4-dichlorophenyl)-4,4',5,5'-tetraphenyl-biimidazole.

Specific examples of the benzophenone based compounds includes thioxanthone, 2,4-diethylthioxanthone, thioxanthone-4-sulfone, benzophenone, 4 4'-bis(dimethylamino) benzophenone, 4,4'-bis(diethylamino)benzophenone, or the combination of the above. The benzophenone based compound is preferably 4,4'-bis(diethylamino)benzophenone.

Specific examples of the α-diketone based compounds includes benzyl, diacetyl, or the combination of the above. The α-diketone based compounds can be used alone or in multiple combinations.

Specific examples of the acyloin based compounds include benzoin. The acyloin based compounds can be used alone or in multiple combinations.

Specific examples of the acyloin ether based compounds include benzoin methylether, benzoin ethylether, benzoin isopropyl ether, or the combination of the above. The acyloin ether based compounds can be used alone or in multiple combinations.

Specific examples of the acylphosphineoxide based compounds includes 2,4,6-trimethylbenzyl diphenyl acylphosphineoxide, bis(2,6-dimethoxybenzyl)-2,4,4,-trimethylphenyl acylphosphineoxide, or the combination of the above. The acylphosphineoxide based compounds can be used alone or in multiple combinations.

Specific example of the quinone based compounds includes anthraquinone, 1,4-naphthoquinone, or the combination of the above. The quinone based compounds can be used alone or in multiple combinations.

Specific examples of the halogen containing compounds include phenacyl chloride, tribromomethyl phenylsulfone, tris(trichloromethyl)s-striazine, or the combination of the above. The halogen containing compounds can be used alone or in multiple combinations.

Specific examples of the peroxides include di-tert-butyl peroxide etc. The peroxides can be used alone or in multiple combinations.

In the photosensitive resin composition of the present invention, based on an amount of 100 parts by weight of the alkali-soluble resin (A), the usage amount of the photoinitiator (C) is 10 parts by weight to 100 parts by weight, preferably 15 parts by weight to 90 parts by weight, more preferably 20 parts by weight to 80 parts by weight. When the photosensitive resin composition includes the O-acyloxime photoinitiator (C-1), the development resistance can be further improved.

Organic Solvent (D)

The organic solvent (D) needs to be able to dissolve the alkai-soluble resin (A), the compound (B) containing an ethylenically unsaturated group and the photoinitiator (C). Moreover, the organic solvent (D) does not react mutually with these ingredients and has an appropriate volatility.

Examples of the organic solvent (D) include: (poly) alkylene glycol monoalkyl ethers such as ethylene glycol monomethyl ether, ethylene glycol monoethyl ether, diethylene glycol methyl ether, diethylene glycol ethyl ether, diethylene glycol n-propyl ether, diethylene glycol n-butyl ether, triethylene glycol methyl ether, triethylene glycol ethyl ether, propylene glycol methyl ether, propylene glycol ethyl ether, dipropylene glycol methyl ether, dipropylene glycol ethyl ether, dipropylene glycol n-propyl ether, dipropylene glycol n-butyl ether, tripropylene glycol methyl ether, and tripropylene glycol ethyl ether; (poly)alkylene glycol monoalkyl ether acetates such as ethylene glycol monomethyl ether acetate, ethylene glycol monoethyl ether acetate, propylene glycol monomethyl ether acetate, and propylene glycol monoethyl ether acetate; other ethers such as diethylene glycol dimethyl ether, diethylene glycol methyl ethyl ether, diethylene glycol diethyl ether, and tetrahydrofuran; ketones such as methyl ethyl ketone, cyclohexanone, 2-heptanone, and 3-heptanone; alkyl lactates such as methyl 2-hydroxypropanoate and ethyl 2-hydroxypropanoate; other esters such as methyl 2-hydroxy-2-methylpropanoate, ethyl 2-hydroxy-2-methylpropanoate, methyl 3-methoxypropanoate, ethyl 3-methoxypropanoate, methyl 3-ethoxypropanoate, ethyl 3-ethoxypropanoate (EEP), ethyl ethoxyacetate, ethyl hydroxyacetate, methyl 2-hydroxy-3-methylenebutyrate, 3-methyl-3-methoxybutyl acetate, 3-methyl-3-methoxybutyl propanoate, ethyl acetate, n-propyl acetate, isopropyl acetate, n-butyl acetate, isobutyl acetate, n-amyl acetate, isoamyl acetate, n-butyl propanoate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, and ethyl 2-oxybutyrate; aromatic hydrocarbons such as toluene and xylene; carboxylic amines such as N-methylpyrrolidone, N,N-dimethylformamide, and N,N-dimethylacetamide. The organic solvent (D) is preferably propylene glycol monomethyl ether acetate or ethyl 3-ethoxypropionate. Moreover, the above solvent may be used alone or in multiple combinations.

Based on an amount of 100 parts by weight of the alkali-soluble resin (A), the amount of the solvent (D) is 1000 parts by weight to 10000 parts by weight, preferably 1500 parts by weight to 9000 parts by weight, more preferable 2000 parts by weight to 8000 parts by weight.

Pigment (E)

The pigment (E) may be an inorganic pigment, an organic pigment, or a mixture thereof. The inorganic pigment may be a metal compound such as a metal oxide compound or a metallic complex salt, and examples thereof include metal oxides such as iron, cobalt, aluminum, cadmium, lead, copper, titanium, magnesium, chromium, zinc, and antimony, and composite oxides of the metals thereof.

Specific examples of the organic pigment include, for instance, C. I. pigment yellow 1, 3, 11, 12, 13, 14, 15, 16, 17, 20, 24, 31, 53, 55, 60, 61, 65, 71, 73, 74, 81, 83, 93, 95, 97, 98, 99, 100, 101, 104, 106, 108, 109, 110, 113, 114, 116, 117, 119, 120, 126, 127, 128, 129, 138, 139, 150, 151, 152, 153, 154, 155, 156, 166, 167, 168, 175; C. I. pigment orange 1, 5, 13, 14, 16, 17, 24, 34, 36, 38, 40, 43, 46, 49, 51, 61, 63, 64, 71, 73; C. I. pigment red 1, 2, 3, 4, 5, 6, 7, 8, 9, 10, 11, 12, 14, 15, 16, 17, 18, 19, 21, 22, 23, 30, 31, 32, 37, 38, 40, 41, 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187, 188, 190, 193, 194, 202, 206, 207, 208, 209, 215, 216, 220, 224, 226, 242, 243, 245, 254, 255, 264, 265; C. I. pigment violet 1, 19, 23, 29, 32, 36, 38, 39; C. I. pigment blue 1, 2, 15, 15:3, 15:4, 15:6, 16, 22, 60, 66; C. I. pigment green 7, 36, 37; C. I. pigment brown 23, 25, 28; C. I. pigment black 1, 7. The pigment (E) can be used alone or in multiple combinations.

Based on an amount of 100 parts by weight of the alkali-soluble resin (A), the amount of the pigment (E) is 100 parts by weight to 1000 parts by weight, preferably 150 parts by weight to 800 parts by weight, more preferably 200 parts by weight to 600 parts by weight.

Additive (F)

Additive (F) includes a surfactant, a filler, a polymer (other than the alkali-soluble resin (A) mentioned above), an adhesion promoter, an antioxidant, an ultraviolet absorber, and an anti-coagulant.

The surfactant helps to improve the coating properties of the photosensitive resin composition. The surfactant is, for instance, a polyoxyethylene alkyl ether such as polyoxyethylene lauryl ether, polyoxyethylene stearyl ether, or polyoxyethylene oleyl ether; a polyoxyethylene alkyl phenyl ether such as polyoxyethylene octyl phenyl ether or polyoxyethylene nonyl phenyl ether; a polyethylene glycol dialkyl ester such as polyethylene glycol dilaurate or polyethylene glycol distearate; a sorbitan fatty acid ester; a fatty acid-modified polyester; a tertiary amine-modified polyurethane; or KP manufactured by Shin-Etsu Chemical Co., Ltd., SF-8427 manufactured by Toray Dow Corning, Polyflow manufactured by Kyoei-Sha Yushi Kagaku Kogyo Co., Ltd., F-Top manufactured by Tochem Products Co., Ltd., Megafac manufactured by Dainippon Ink & Chemicals, Inc., Fluorade manufactured by Sumitomo 3M Co., Ltd., Asahi Guard manufactured by Asahi Glass, or Surflon manufactured by Asahi Glass.

Specific examples of the filler include, for instance, glass and aluminum. Specific examples of the polymer include polyvinyl alcohol, polyethylene glycol monoalkyl ether, polyfluoro alkyl acrylate etc. Specific examples of the adhesion promoter includes: vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidyloxy propyltrimethoxysilane, 3-glycidyloxy propylmethyldimethoxysilane, 2-(3,4-epoxycyclohexyl)ethyltrimethoxysilane, 3-chloropropylmethyl dimethoxysilane, 3-chloropropyltrimethoxysilane, 3-methacryloyloxypropyltrimethoxysilane, 3-mercaptopropyltrimethoxysilane etc.

Specific examples of the antioxidant includes 2,2-thiobis(4-methyl-6-t-butylphenol), 2,6-di-t-butylphenol etc. Specific examples of the ultraviolet absorber include 2-(3-t-butyl-5-methyl-2-hydroxyphenyl)-5-chlorophenylazide, alkoxy phenone etc. Specific examples of the anti-coagulant include, for instance, sodium polyacrylate etc.

Based on an amount of 100 parts by weight of the alkali-soluble resin (A), the amount of the additive (F) is 0 parts by weight to 10 parts by weight, preferably 1 parts by weight to 8 parts by weight, more preferably 3 parts by weight to 5 parts by weight.

Method for Preparing Photosensitive Resin Composition for Color Filter

A method that can be used to prepare the photosensitive resin composition includes, for instance: placing and stirring the alkali-soluble resin (A), the compound (B) containing an ethylenically unsaturated group, the photoinitiator (C), the organic solvent (D) and the pigment (E) in a stirrer such that the compositions are uniformly mixed into a solution state. When needed, the additive (F) can also be added. After the compositions are uniformly mixed, a photosensitive resin composition in a solution state can be obtained.

Method for Preparing Pixel Layer of Color Filter

The color filter of the present invention includes a pixel layer formed by a lithography process of the photosensitive resin composition for color filter described above.

During the formation of the pixel layer, the above photosensitive resin composition in a solution state for a color filter is uniformly coated on a substrate by a coating method such as spin coating, cast coating, or roll coating. The substrate is, for instance, a glass for a liquid crystal display device such as alkali-free glass, soda-lime glass, hard glass (Pyrex glass), quartz glass, or a glass attached with a transparent conductive film; a substrate (such as a silicon substrate) for a photoelectric conversion device (such as a solid-state imaging apparatus). Moreover, prior to coating the photosensitive resin composition in a solution state for a color filter on the substrate, a light-shielding black matrix is pre-formed on the substrate and is capable of isolating red, green, and blue pixel color layers.

After coating, the organic solvent of the photosensitive resin composition is removed by drying under reduced pressure. It should be mentioned that, the conditions for drying under reduced pressure may vary according to the type and the ratio of each composition. Generally, drying under reduced pressure is performed at a pressure of 0 mmHg to 200 mmHg for 1 second to 60 seconds.

After drying under reduced pressure, an exposure process is performed on the coating film using a photomask with a predetermined pattern. The light used in the exposure process is preferably an ultraviolet (UV) ray such as a g-ray, a b-ray, or an i-ray, and the equipment for emitting the UV ray is, for instance, a(n) (ultra-)high pressure mercury lamp or a metal halide lamp.

After the exposure process, the coating film is immersed in a developing solution at a temperature of 21° C. to 25° C., and developed for about 15 seconds to 5 minutes to remove the unnecessary portion of the coating film so as to form a predetermined pattern on the substrate. The developing solution can be an alkali aqueous solution containing alkali compounds such as sodium hydroxide, potassium hydroxide, sodium carbonate, sodium bicarbonate, potassium carbonate, potassium bicarbonate, sodium silicate, sodium methylsilicate, aqueous ammonia, ethylamine, diethylamine, dimethyl ethanol amine, tetramethylammonium hydroxide, tetraethylammonium hydroxide, choline, pyrrole, piperidine, or 1,8-diazabicyclo-[5,4,0]-7-undecene. The concentration thereof is 0.001 wt % to 10 wt %, preferably 0.005 wt % to 5 wt %, and more preferably 0.01 wt % to 1 wt %.

Next, the pattern on the substrate is washed with water, and then the pattern is dried with compressed air or compressed nitrogen. Lastly, a post-bake process is performed on the pattern with a heating apparatus such as a hot plate or an oven. In particular, the heating temperature is set between 150° C. and 250° C., the heating time when using the hot plate is 5 minutes to 60 minutes, and the heating time when using the oven is 15 minutes to 150 minutes. The pattern is thereby fixed so as to form a pixel layer.

By repeating the steps above, pixel layers of, for instance, red, green, and blue can be formed in sequence on the substrate.

Method of Forming Color Filter

A sputtering process is performed on the surface of the pixel layer under a vacuum environment at a temperature of 220° C. to 250° C. to form an ITO protective film. Subsequently, an etching and wiring process is performed on the ITO protective film, wherein the surface of ITO protective film is coated with an alignment film so as to produce the color filter of the present invention.

Method of Forming Liquid Crystal Display Device

A liquid crystal display device including the above color filter is provided in the present invention. The formation method thereof will be described in detail below.

The color filter formed by the method for manufacturing the color filter and a substrate provided with a thin film transistor (TFT) are arranged opposite to each other with a cell gap in between. A sealing agent is used to adhere the color filter and the peripheral portion of the substrate, leaving an injection hole. Next, liquid crystals are filled into the cell gap defined by the surfaces of the substrate and the sealing agent through the injection hole. Lastly, the injection hole is sealed up to final a liquid crystal cell. Then, a polarizer is adhered to the other side of the color filter that contacts the liquid crystal layer and the other side of the substrate that contacts the liquid crystal layer so as to form the liquid crystal display device. The liquid crystal (i.e. liquid crystal compound or liquid crystal composition) is not particularly limited, and any known liquid crystal compound and liquid crystal composition can be used.

Moreover, the liquid crystal alignment used in the manufacturing of the color filter is used to limit the alignment of the liquid crystals, and is not particularly limited. For instance, any inorganic or organic materials may be used, and the present invention is not particularly limited thereto.

The following examples are used to describe the present invention. However, the present invention is not limited by the disclosure of these examples.

EXAMPLE

Synthesis Example of First Alkali Soluble Resin (A-1)

In the following, synthesis example A-1-1 to synthesis example A-1-9 of the first alkali-soluble resin (A-1) are described:

Synthesis Example A-1-1

In a four-necked flask, a stirrer, a thermometer, a condenser tube and a nitrogen inlet were provided, and nitrogen gas was introduced. Thereafter, 100 parts by weight of propylene glycol methyl ether acetate (hereinafter PGMEA) was added, and the temperature was raised to 100° C. Next, 50 parts by weight of methacrylic acid (hereinafter MAA), 30 parts by weight of glycidyl acrylate (hereinafter GA), 20 parts by weight of glycidyl methacrylate (hereinafter GMA) and 4.5 parts by weight of 2,2'-azobis-2-methylbutyronitrile (hereinafter AMBN) were dissolved in 100 parts by weight of PGMEA, and the solution mixture was added drop-wise to the four-neck flask in a period of 2 hours. After reacting at 100° C. for 6.5 hours, 30 parts by weight of the xanthene derivative (a1-1) represented by formula (2-1) is added thereto, and the temperature was raised to 110° C. After reacting for 6 hours, the first alkali-soluble resin (A-1-1) of synthesis example A-1-1 can be obtained.

Synthesis Example A-1-2 to Synthesis Example A-1-6

Synthesis example A-1-2 to synthesis example A-1-6 were synthesized with the same steps as synthesis example A-1-1 to prepare the first alkali-soluble resin (A-1), and the difference thereof is: the reaction temperature, polycondensation time, the amount and type of composition thereof were changed, and the specific details are as shown in Table 1.

Synthesis Example A-1-7

To a 500 ml four-necked flask, 100 parts by weight of an epoxy fluorene compound (product type: ESF-300, made by Nippon Steel Chemical Co., Ltd.; 231 equivalents of the epoxy group), 30 parts by weight of acrylic acid, 0.3 parts by weight of benzyltriethylammonium chloride, 0.1 parts by weight of 2,6-di-t-butyl-p-cresol and 130 parts by weight of propylene glycol methyl ether acetate were continuously added thereto. The addition speed was controlled at 25 parts by weight/minute, and the temperature was maintained in a range of 100° C. to 110° C. After reaction for 15 hours, a pale yellow transparent mixture with 50 wt % solid content concentration can be obtained.

Next, 100 parts by weight of the above mixture solution was dissolved into 25 parts by weight of ethylene glycol monoethyl ether acetate, and 6 parts by weight of tetrahydrophthalic anhydride and 13 parts by weight of benzophenone tetracarboxylic dianhydride were simultaneously added thereto. The reaction mixture was heated to 110° C. to 115° C. and reacted for 2 hours. Next, 30 parts by weight of the xanthene derivative (a1-7) represented by formula (2-5) is added thereto, and reacted at 100° C. for 4 hours to obtain the first alkali-soluble resin (A-1-7).

Synthesis Example A-1-8

To a 500 ml four-necked flask, 100 parts by weight of an epoxy fluorene compound (product type: ESF-300, made by Nippon Steel Chemical Co., Ltd.; 231 equivalents of the epoxy group), 30 parts by weight of acrylic acid, 0.3 parts by weight of benzyltriethylammonium chloride, 0.1 parts by weight of 2,6-di-t-butyl-p-cresol and 130 parts by weight of propylene glycol methyl ether acetate were continuously added thereto. The addition speed was controlled at 25 parts by weight/minute, and the temperature was maintained in a range of 100° C. to 110° C. After reaction for 15 hours, a pale yellow transparent mixture with 50 wt % solid content concentration can be obtained.

Next, 100 parts by weight of the above mixture solution was dissolved into 25 parts by weight of ethylene glycol monoethyl ether acetate, and 13 parts by weight of benzophenone tetracarboxylic dianhydride was simultaneously added thereto. The reaction was carried out at 90° C. to 95° C. for 2 hours. Next, 6 parts by weight of tetrahydrophthalic anhydride was added and reacted at 90° C. to 95° C. for 4 hours. Thereafter, 50 parts by weight of the xanthene derivative (a1-8) represented by formula (2-10) is added, and reacted at 100° C. for 4 hours to obtain the first alkali-soluble resin (A-1-8).

Synthesis Example A-1-9

In a reaction flask, 400 parts by weight of an epoxy compound (product type: NC-3000, manufactured by Nippon Kayaku Co., Ltd; 288 equivalents of the epoxy group), 102 parts by weight of acrylic acid, 0.3 parts by weight of methoxyphenol, 5 parts by weight of triphenyl phosphine and 264 parts by weight of propylene glycol methyl ether acetate were added thereto. The temperature was maintained at 95° C. and reacted for 9 hours to obtain an intermediate product with an acid value of 2.2 mgKOH/g. Next, 151 parts by Weight of tetrahydrophthalic anhydride was added and reacted at 95° C. for 4 hours. Then, 120 parts by weight of the xanthene derivative (a1-9) represented by formula (2-15) is added, and reacted at 100° C. for 4 hours to obtain the first alkali-soluble resin (A-1-9).

The compounds corresponding to the labels of Table 1 are as shown below.

| Abbreviation | Name |
|---|---|
| MAA | Methacrylic acid |
| HOMS | 2-methacryloyloxyethyl succinate monoester |
| AA | Acrylic acid |
| GA | Glycidyl acrylate |
| GMA | Glycidyl methacrylate |
| OXMA | (3-ethyl-3-oxetanyl) methacrylate methoxymethyl ester |
| NPMI | N-phenylmaleimide |
| BzMA | Benzyl methacrylate |
| BMA | N-butyl methacrylate |
| AMBN | 2,2′-azobis-2-methylbutyronitrile |
| ADVN | 2,2-azobis-(2,4-dimethylvaleronitrile) |
| PGMEA | propylene glycol methyl ether acetate |
| EEP | Ethyl 3-ethoxypropionate |
| a1-1 | Compound represented by formula (2-1) |
| a1-2 | Compound represented by formula (2-4) |
| a1-3 | Compound represented by formula (2-7) |
| a1-4 | Compound represented by formula (2-8) |
| a1-5 | Compound represented by formula (2-13) |
| a1-6 | Compound represented by formula (2-14) |

Example 1

100 parts by weight of the first alkali soluble resin (hereinafter A-1-1), 50 parts by weight of dipentaerythritol hexaacrylate (hereinafter B-1), 5 parts by weight of 2,4-bis (trichloromethyl)-6-(p-methoxy)styryl-s-triazine (hereinafter C-2-1), 10 parts by weight of 2,2′-bis(o-chlorophenyl)-4,4′,5,5′-tetraphenyl-biimidazole (hereinafter C-2-2) and 100 parts by weight of pigment C.I. pigment red 254/C.I. pigment yellow 139=80/20 (hereinafter E-1) were added into 1000 parts by weight of propylene glycol methyl ether acetate (hereinafter D-1). The mixture was uniformly stirred with a shaking type stirrer to obtain the photosensitive resin composition of example 1. The obtained photosensitive resin composition was evaluated by each of the following evaluation methods, and the results are as shown in Table 2.

Example 2 to Example 12

The photosensitive resin composition of each of example 2 to example 12 was prepared using the same steps as example 1, with the difference being: the type and the amount of each of the compositions of the photosensitive resin compositions were changed (as shown in Table 2). The obtained photosensitive resin compositions were evaluated by each of the following evaluation methods, and the results are as shown in Table 2.

TABLE 1

| | | | Synthesis example | | | | | |
|---|---|---|---|---|---|---|---|---|
| Composition | | | A-1-1 | A-1-2 | A-1-3 | A-1-4 | A-1-5 | A-1-6 |
| Reactive resin (a2) comprising the second reactive group (parts by weight) | ethylenically unsaturated monomer (i-1) having at least one carboxylic acid group | MAA | 50 | — | 30 | 10 | 20 | — |
| | | HOMS | — | 10 | 10 | 20 | — | 5 |
| | | AA | — | 10 | — | — | 20 | 20 |
| | ethylenically unsaturated monomer (i-2) having an epoxy group | GA | 30 | 50 | 30 | 20 | — | 50 |
| | | GMA | 20 | 20 | — | 20 | 30 | — |
| | | OXMA | — | 10 | 30 | — | — | 20 |
| | other copolymerizable ethylenically unsaturated monomer (i-3) | NPMI | — | — | — | 10 | — | 5 |
| | | BzMA | — | — | — | 20 | 20 | — |
| | | BMA | — | — | — | — | 10 | — |
| | Initiator | AMBN | 4.5 | — | 4.5 | — | — | 4.5 |
| | | ADVN | — | 4.5 | — | 4.5 | 4 | — |
| | Solvent | PGMEA | 200 | — | 200 | — | 180 | — |
| | | EEP | — | 250 | — | 200 | — | 200 |
| Reaction conditions | Reaction temperature (° C.) | | 100 | 105 | 100 | 100 | 100 | 100 |
| | Reaction time (hours) | | 6.5 | 6 | 6 | 6.5 | 6 | 6 |
| Xanthene derivative (a1) comprising a first reactive group | a1-1 | | 30 | — | — | — | 20 | — |
| | a1-2 | | — | 80 | — | 30 | — | — |
| | a1-3 | | — | — | 30 | — | — | — |
| | a1-4 | | — | — | 20 | — | — | 30 |
| | a1-5 | | — | — | — | 10 | — | — |
| | a1-6 | | — | — | — | — | — | 30 |
| Reaction conditions | Reaction temperature (° C.) | | 110 | 110 | 110 | 105 | 115 | 110 |
| | Reaction time (hours) | | 6 | 6.5 | 6 | 6 | 6 | 6.5 |

Examples of Photosensitive Resin Composition

In the following, example 1 to example 12 and comparative example 1 to comparative example 5 of the photosensitive resin composition are described.

Comparative Example 1 to Comparative Example 5

The photosensitive resin composition of each of comparative example 1 to comparative example 5 was prepared using the same steps as example 1, with the difference being: the type and the amount of each of the compositions of the photosensitive resin compositions were changed (as shown in Table 3). The obtained photosensitive resin compositions were evaluated by each of the following evaluation methods, and the results are as shown in Table 3.

Comparative Example 6

In 18 parts by weight of C.I. basic violet 10, 170 parts by weight of anhydrous chlorofolin, 1 parts by weight of camphorsulfonic acid, 1.4 parts by weight of 4-(N, N-dimethylamino) pyridine and 18 parts by weight of 2-hydroxyethyl methacrylate were added thereto and stirred for 30 minutes. The mixture was slowly added to a pre-dissolved solution of 10.5 parts by weight of 1-ethyl-3-(3-dimethylaminopropyl) carbodiimide hydrochloride in 47 parts by weight of anhydrous chloroform, and stirred at room temperature for 2 hours. Next, a liquid separation step was performed twice by using 150 parts by weight of 1N aqueous hydrochloric acid solution, and further using 150 parts by weight of 10% brine to wash the organic layer twice. Finally, 43 parts by weight of anhydrous magnesium sulfate was added thereto and stirred for 30 minutes. The desiccant was filtered and the solvent was distilled off, and 80 parts by weight of propylene glycol monomethyl ether was added thereto to obtain a solution W1.

In 72.5 parts by weight of propylene glycol monomethyl ether acetate, 15 parts by weight of C.I. pigment red 254 and 12.5 parts by weight of BYK-LPN21116 (produced by BYK, TS=40 wt %) was added thereto to obtain a solution W2.

In a flask that is equipped with a condenser tube and stirrer, 100 parts by weight of propylene glycol monomethyl ether acetate was added thereto, and nitrogen exchange was performed. The flask was heated to 80° C., and under the same temperature, a mixture solution of 100 parts by weight of propylene glycol monomethyl ether acetate, 20 parts by weight of methacrylic acid, 10 parts by weight of styrene, 5 parts by weight of benzyl methacrylate, 15 parts by weight of 2-hydroxyethyl methacrylate, 23 parts by weight of 2-ethylhexyl methacrylate, 12 parts by weight of N-phenyl maleimide, 15 parts by weight of (2-acryloyloxyethyl) succinate monoester and 6 parts by weight of 2,2'-azobis(2,4-dimethylvaleronitrile) was added drop-wise within 1 hour, and the temperature was maintained for 2 hours to undergo polymerization. Thereafter, the temperature of the reacting solution was raised to 100° C., where polymerization was performed for another hour to obtain a solution W3.

Next, 7.2 parts by weight of solution W1, 13.5 parts by weight of solution W2 and 21.6 parts by weight of solution W3, 9.2 parts by weight of cross-linking agent M-402 (made by Toagosei), 2.2 parts by weight of photoinitiator IRGA-CURE 369 (made by Ciba), 0.1 parts by weight of photoinitiator NCI-930 (made by ADEKA) and 0.2 parts by weight of surfactant F-554 (made by DIC) were added to a suitable amount of propylene glycol monomethyl ether. The mixture was uniformly stirred with a shaking type stirrer to obtain the photosensitive resin composition for color filter of comparative example 6 (TS=20 wt %). The obtained photosensitive resin composition was evaluated by each of the following evaluation methods, and the results for the contrast and development resistance are both X.

The compounds corresponding to the labels of Tables 2 and 3 are as shown below.

| Abbreviation | Name |
|---|---|
| A-1-1 | First alkali soluble resin (A-1-1) of synthesis example A-1-1 |
| A-1-2 | First alkali soluble resin (A-1-2) of synthesis example A-1-2 |
| A-1-3 | First alkali soluble resin (A-1-3) of synthesis example A-1-3 |
| A-1-4 | First alkali soluble resin (A-1-4) of synthesis example A-1-4 |
| A-1-5 | First alkali soluble resin (A-1-5) of synthesis example A-1-5 |
| A-1-6 | First alkali soluble resin (A-1-6) of synthesis example A-1-6 |
| A-1-7 | First alkali soluble resin (A-1-7) of synthesis example A-1-7 |
| A-1-8 | First alkali soluble resin (A-1-8) of synthesis example A-1-8 |
| A-1-9 | First alkali soluble resin (A-1-9) of synthesis example A-1-9 |
| A-2-1 | Urethane based resin (UXE-3044 made by NIPPON KAYAKU) |
| A-2-2 | Novolac based resin (GTR-M2 made by GUN EI Chemical Industry) |
| B-1 | dipentaerythritol hexaacrylate |
| B-2 | trimethylolpropyl triacrylate |
| B-3 | EO-modified trimethylolpropyl triacrylate |
| C-1-1 | 1-[4-(phenylthio)phenyl]-octane-1,2-dione 2-(O-benzoyloxime) |
| C-1-2 | 1-[9-ethyl-6-(2-methylbenzoyl)-9H-carbazol-3-yl]-ethanone 1-(O-acetyloxime) |
| C-1-3 | Compound represented by formula (C-1a) |
| C-2-1 | 2,4-bis(trichloromethyl)-6-(p-methoxy)styryl-s-triazine |
| C-2-2 | 2,2'-bis(o-chlorophenyl)-4,4',5,5'-tetraphenyl-biimidazole |
| D-1 | propylene glycol monomethyl ether acetate |
| D-2 | ethyl 3-ethoxypropionate |
| D-3 | N,N-dimethylformamide |
| E-1 | C.I. pigment red 254/C.I. pigment yellow139 = 80/20 |
| E-2 | C.I. pigment green 36/C.I. pigment yellow 150 = 60/40 |
| E-3 | C.I. pigment blue 15:6 |
| E-4 | C.I. pigment purple 1 |
| F-1 | 2,6-di tert-butyl phenol |
| F-2 | vinyltris(2-methoxyethoxy)silane |

Evaluation Method
(a) Contrast

The photosensitive resin composition was coated on a glass substrate having a length and a width of 100 mm with a spin coating method. Then, the glass substrate was dried at a reduced pressure of about 100 mmHg for about 30 seconds. Next, the glass substrate was prebaked at 80° C. for 3 minutes to form a pre-baked coating film having a film thickness of 2.5 μm. Then, the pre-baked coating film was irradiated with 300 mJ/cm$^2$ of ultraviolet light with an exposure machine (manufactured by Canon, Model PLA-501F). After the ultraviolet light irradiation, the pre-baked coating film was immersed in a developing solution at 23° C. for 2 minutes. Then, the pre-baked coating film was washed with pure water and post-baked at 200° C. for 80 minutes to form a photosensitive resin layer having a film thickness of 2.0 microns on the glass substrate.

Figure 2:
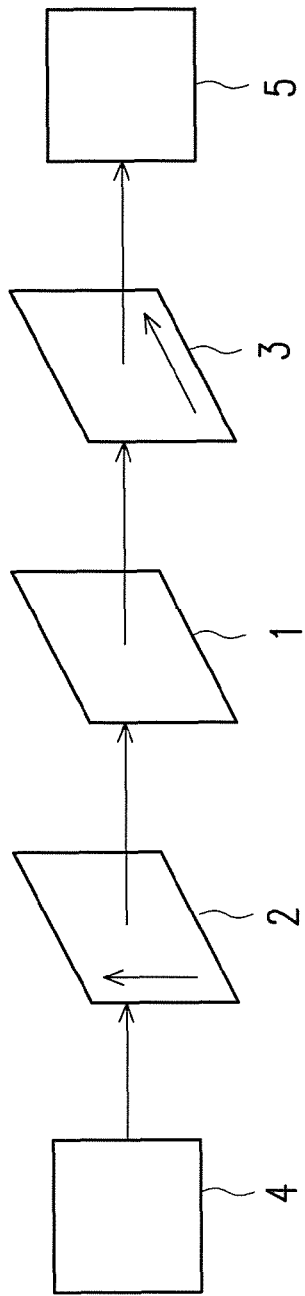
FIG. 2 is a schematic diagram of a photosensitive resin layer contrast measurement status (2).

The brightness value of the photosensitive resin layer having a film thickness of about 2.0 microns was measured with a detection apparatus illustrated in FIG. 1 and FIG. 2, and the ratio of brightness was calculated. Herein, the obtained photosensitive resin layer (1) is disposed between two polarizing plate (2), (3), and the light irradiated from the light source (2) passes through the polarizing plate (2), the color filter (1) and the polarizing plate (3) sequentially. After passing through the polarizing plate (2), the brightness B (cd/cm$^2$) was calculated by using a brightness meter 150 (manufactured by Topcon, Model BM-5A).

As shown in FIG. 1, when the polarizing direction of the polarizing plate (3) is parallel to the polarizing direction of the polarizing plate (2), the measured brightness is A (cd/cm²). In addition, as shown in FIG. 2, when the polarizing direction of the polarizing plate (3) is perpendicular to the polarizing direction of the polarizing plate (2), the measured brightness is B (cd/cm²). The contrast is obtained by calculating a ratio of brightness A to brightness B (brightness A/brightness B), and the evaluation criteria are as follows:

○: 1500≤(brightness A/brightness B)
Δ: 900≤(brightness A/brightness B)<1500
X: (brightness A/brightness B)<900

(b) Development Resistance

The photosensitive resin composition was coated on a glass substrate having a length and a width of 100 mm with a spin coating method. The glass substrate was dried at a reduced pressure of about 100 mmHg for about 30 seconds. Next, the glass substrate was prebaked at 80° C. for 2 minutes to form a pre-baked coating film having a film thickness of 2.5 μm. Subsequently, a colorimeter (model MCPD; manufactured by Otsuka Electronics Co., Ltd.) was used to measure the chromaticity (L*, a*, b*).

Next, a 100 mJ/cm² of ultraviolet light (exposure apparatus, Canon PLA-501F) was irradiated on the pre-baked coating film, and the pre-baked coating film was immersed in a developing solution at 23° C. for 1 minute, and subsequently washed with water. Next, the chromaticity was measured again, and the change in chromaticity (Δ Eab*) was evaluated using the following criteria Δ Eab*=$[(\Delta L)^2+(\Delta a)^2+(\Delta b)^2]^{1/2}$. The smaller the Δ Eab* represents a better development resistance. The evaluation criteria are as follows.

◎: Δ Eab*<2
○: 2≤Δ Eab*<4
Δ: 4≤Δ Eab*<6
X: 6≤Δ Eab*

TABLE 2

| Composition | | Example | | | | | |
|---|---|---|---|---|---|---|---|
| | | 1 | 2 | 3 | 4 | 5 | 6 |
| Alkali soluble resin (A) (parts by weight) | A-1-1 | 100 | — | — | — | — | — |
| | A-1-2 | — | 100 | — | — | — | — |
| | A-1-3 | — | — | 100 | — | — | — |
| | A-1-4 | — | — | — | 100 | — | — |
| | A-1-5 | — | — | — | — | 100 | — |
| | A-1-6 | — | — | — | — | — | 100 |
| | A-1-7 | — | — | — | — | — | — |
| | A-1-8 | — | — | — | — | — | — |
| | A-1-9 | — | — | — | — | — | — |
| | A-2-1 | — | — | — | — | — | — |
| | A-2-2 | — | — | — | — | — | — |
| Compound (B) containing an ethylenically unsaturated group (parts by weight) | B-1 | 50 | — | — | 300 | — | 200 |
| | B-2 | — | 150 | — | 200 | 100 | — |
| | B-3 | — | — | 300 | — | 100 | — |
| Photoinitiator (C) (parts by weight) | C-1-1 | — | — | 30 | — | — | — |
| | C-1-2 | — | — | 20 | 20 | 25 | — |
| | C-1-3 | — | — | — | — | 25 | — |
| | C-2-1 | 5 | 10 | — | 30 | — | 15 |
| | C-2-2 | 10 | 20 | — | 30 | — | 5 |
| Organic solvent (D) (parts by weight) | D-1 | 1000 | — | — | 9000 | — | 150 |
| | D-2 | — | 3000 | — | 1000 | — | 1800 |
| | D-3 | — | — | 4500 | — | 2000 | — |
| Pigment (E) (parts by weight) | E-1 | 100 | — | — | 800 | — | — |
| | E-2 | — | 300 | — | — | 200 | — |
| | E-3 | — | — | 500 | 200 | — | 180 |
| | E-4 | — | — | — | — | — | — |
| Additive (F) | F-1 | — | — | — | 3 | — | — |
| | F-2 | — | — | — | — | — | — |
| Contrast | | ○ | ○ | ○ | ○ | ○ | ○ |
| Development resistance | | ○ | ○ | ◎ | ◎ | ◎ | ○ |

| Composition | | Example | | | | | |
|---|---|---|---|---|---|---|---|
| | | 7 | 8 | 9 | 10 | 11 | 12 |
| Alkali soluble resin (A) (parts by weight) | A-1-1 | — | — | 80 | — | — | — |
| | A-1-2 | — | — | — | 90 | — | 50 |
| | A-1-3 | — | — | — | — | — | 50 |
| | A-1-4 | — | — | — | — | 30 | — |
| | A-1-5 | — | — | — | — | — | — |
| | A-1-6 | — | — | — | — | — | — |
| | A-1-7 | 60 | — | — | — | — | — |
| | A-1-8 | 40 | — | — | — | — | — |
| | A-1-9 | — | 100 | — | — | — | — |
| | A-2-1 | — | — | 20 | — | 70 | — |
| | A-2-2 | — | — | — | 10 | — | — |

TABLE 2-continued

| Compound (B) containing an ethylenically unsaturated group (parts by weight) | B-1 | 100 | — | — | — | 300 | — |
|---|---|---|---|---|---|---|---|
| | B-2 | — | — | 200 | — | — | 200 |
| | B-3 | 200 | 150 | — | 400 | — | 50 |
| Photoinitiator (C) (parts by weight) | C-1-1 | 10 | — | — | 20 | — | 30 |
| | C-1-2 | 25 | 50 | — | — | 15 | — |
| | C-1-3 | 10 | — | — | — | — | — |
| | C-2-1 | — | — | 30 | 30 | 25 | 20 |
| | C-2-2 | — | 20 | 20 | 10 | — | — |
| Organic solvent (D) (parts by weight) | D-1 | 1000 | 200 | — | 2500 | — | 2000 |
| | D-2 | — | 1600 | 1000 | — | 3000 | 1000 |
| | D-3 | 1000 | 200 | 2000 | 2500 | — | — |
| Pigment (E) (parts by weight) | E-1 | 250 | — | — | 500 | — | 100 |
| | E-2 | — | — | 200 | — | — | 200 |
| | E-3 | — | 250 | — | — | 500 | — |
| | E-4 | 50 | — | — | — | — | — |
| Additive (F) | F-1 | — | — | — | — | — | 2 |
| | F-2 | — | — | 1 | — | — | 2 |
| Contrast | | ○ | ○ | ○ | ○ | ○ | ○ |
| Development resistance | | ◎ | ◎ | ○ | ◎ | ◎ | ◎ |

TABLE 3

| Composition | | Comparative Example | | | | |
|---|---|---|---|---|---|---|
| | | 1 | 2 | 3 | 4 | 5 |
| Alkali soluble resin (A) (parts by weight) | A-1-1 | — | — | — | — | — |
| | A-1-2 | — | — | — | — | — |
| | A-1-3 | — | — | — | — | — |
| | A-1-4 | — | — | — | — | — |
| | A-1-5 | — | — | — | — | — |
| | A-1-6 | — | — | — | — | — |
| | A-1-7 | — | — | — | — | — |
| | A-1-8 | — | — | — | — | — |
| | A-1-9 | — | — | — | — | — |
| | A-2-1 | 100 | — | 100 | — | — |
| | A-2-2 | — | 100 | — | 100 | 100 |
| Compound (B) containing an ethylenically unsaturated group (parts by weight) | B-1 | 50 | — | — | 300 | 50 |
| | B-2 | — | 150 | — | 200 | — |
| | B-3 | — | — | 300 | — | — |
| Photoinitiator (C) (parts by weight) | C-1-1 | — | — | 30 | — | — |
| | C-1-2 | — | — | 20 | 20 | — |
| | C-1-3 | — | — | — | — | — |
| | C-2-1 | 5 | 10 | — | 30 | 5 |
| | C-2-2 | 10 | 20 | — | 30 | 10 |
| Organic solvent (D) (parts by weight) | D-1 | 1000 | — | — | 9000 | 1000 |
| | D-2 | — | 3000 | — | 1000 | — |
| | D-3 | — | — | 4500 | — | — |
| Pigment (E) (parts by weight) | E-1 | 100 | — | — | 800 | 100 |
| | E-2 | — | 300 | — | — | — |
| | E-3 | — | — | 500 | 200 | — |
| | E-4 | — | — | — | — | 100 |
| Additive (F) | F-1 | — | — | — | 3 | — |
| | F-2 | — | — | — | — | — |
| Contrast | | X | X | X | X | X |
| Development resistance | | Δ | Δ | ○ | ○ | Δ |

Evaluation Result

It can be known from Table 2 and Table 3 that, in comparison to the photosensitive resin composition (example 1 to example 12) that contains the first alkali soluble resin (A-1), the photosensitive resin composition (comparative example 1 to comparative example 5) that does not contain the first alkali soluble resin have a poor contrast. As such, it can be noted that in the photosensitive resin composition, when the first alkali soluble resin (A-1) is not present, the photosensitive resin composition will have a poor contrast.

In addition, when the photosensitive composition includes the O-acyloxime photoinitiator (C-1) (examples 3 to 5, examples 7 to 8 and examples 10 to 12), the development resistance of the photosensitive resin composition can be further improved.

Accordingly, a first alkali soluble resin (A-1) is included in the photosensitive resin of the present invention, therefore the problem where the color filter has a low contrast can be resolved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A photosensitive resin composition, comprising:
    an alkali soluble resin (A);
    a compound (B) containing an ethylenically unsaturated group;
    a photoinitiator (C);
    an organic solvent (D); and
    a pigment (E);
    wherein, the alkali soluble resin (A) comprises a first alkali soluble resin (A-1) having the structure represented by formula (1);

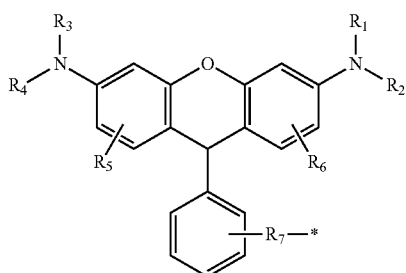
formula (1)

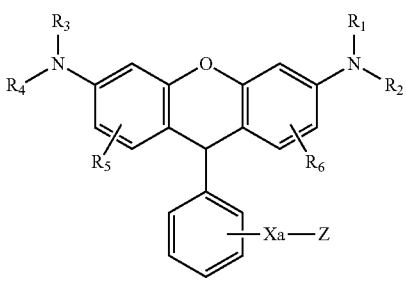
formula (2)

in formula (1), $R_1$, $R_2$, $R_3$ and $R_4$ each independently represents a hydrogen, a $C_1$ to $C_8$ alkyl group, a $C_3$ to $C_8$ cycloalkyl group or phenyl group, wherein the alkyl group, the cycloalkyl group and the phenyl group may be substituted; $R_5$ and $R_6$ each independently represents a hydrogen, a $C_1$ to $C_8$ alkyl group or chlorine; $R_7$ represents a divalent organic group; * represents a bonding position, wherein the first alkali soluble resin (A-1) is obtained by the reaction between a xanthene derivative (a1) comprising a first reactive group and a reactive resin (a2) comprising a second reactive group, wherein the first reactive group and the second reactive group cannot be the same group.

2. The photosensitive resin composition of claim 1, wherein the divalent organic group $R_7$ in the first alkali soluble resin (A-1) is represented by the following formula:

wherein, Xa represents a single bond or methylene; Xb represents

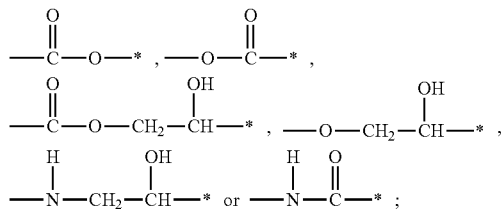

* represents a bonding position.

3. The photosensitive resin composition of claim 1, wherein the xanthene derivative (a1) comprising the first reactive group is represented by formula (2):

in formula (2), Xa represents a single bond or methylene; Z represent —COOH, —OH or —NH$_2$.

4. The photosensitive resin composition of claim 1, wherein the reactive resin (a2) comprising the second reactive group is a copolymer obtained by the polymerization of an ethylenically unsaturated monomer (i-1) having at least one carboxylic acid group and an ethylenically unsaturated monomer (i-2) having an epoxy group.

5. The photosensitive resin composition of claim 1, wherein the reactive resin (a2) comprising the second reactive group is a copolymer obtained by the polymerization reaction of an epoxy resin (ii-1) having at least two epoxy groups and a compound (ii-2) having at least one carboxylic acid group and at least one ethylenically unsaturated group.

6. The photosensitive resin composition of claim 5, wherein the epoxy resin (ii-1) having at least two epoxy groups is represented by formula (3):

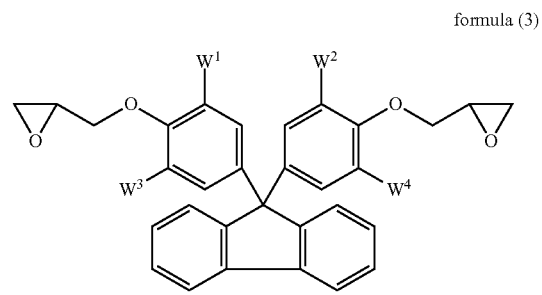
formula (3)

in formula (3), $W^1$, $W^2$, $W^3$ and $W^4$ are respectively the same or different and represent a hydrogen atom, a halogen atom, a $C_1$ to $C_5$ alkyl group, a $C_1$ to $C_5$ alkoxy group, a $C_6$ to $C_{12}$ aryl group, or a $C_6$ to $C_{12}$ aralkyl group.

7. The photosensitive resin composition of claim 5, wherein the epoxy resin (ii-1) having at least two epoxy groups is represented by formula (4):

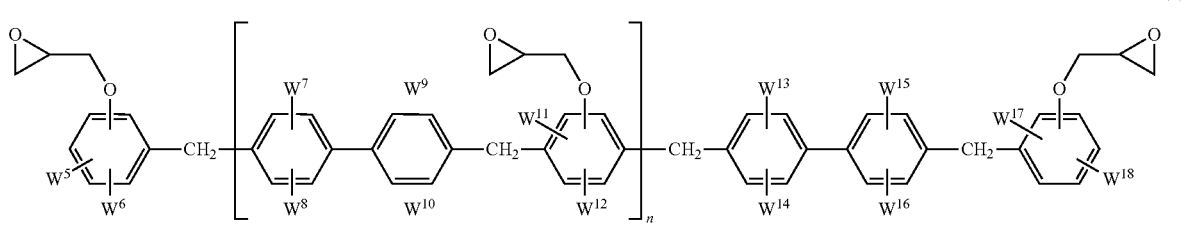
formula (4)

in formula (4), $W^5$ to $W^{18}$ are respectively the same or different and represent a hydrogen atom, a halogen atom, a $C_1$-$C_8$ alkyl group, and a $C_6$-$C_{15}$ aryl group; and n represents an integer ranging from 0 to 10.

8. The photosensitive resin composition of claim 1, wherein the photoinitiator (C) comprises an O-acyloxime photoinitiator (C-1).

9. The photosensitive resin composition of claim 1, wherein based on 100 parts by weight of the alkali soluble resin (A), an amount of the first alkali soluble resin (A-1) is 30 parts by weight to 100 parts by weight.

10. The photosensitive resin composition of claim 1, wherein based on 100 parts by weight of the alkali soluble resin (A), an amount of the compound (B) containing an ethylenically unsaturated group is 50 parts by weight to 500 parts by weight, an amount of the photoinitiator (C) is 10 parts by weight to 100 parts by weight, an amount of the organic solvent (D) is 1000 parts by weight to 10000 parts by weight, and an amount of the pigment (E) is 100 parts by weight to 1000 parts by weight.

11. A manufacturing method for a color filter, using the photosensitive resin composition in claim 1 to form a pixel layer.

12. A color filter, formed by using the manufacturing method of claim 11.

13. A liquid crystal display device, comprising the color filter of claim 12.

* * * * *